US 8,294,623 B2

(12) United States Patent
Okazaki

(10) Patent No.: US 8,294,623 B2
(45) Date of Patent: Oct. 23, 2012

(54) ELECTROMAGNETIC WAVE MEASURING APPARATUS

(75) Inventor: Masahiro Okazaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 507 days.

(21) Appl. No.: 12/614,930

(22) Filed: Nov. 9, 2009

(65) Prior Publication Data

US 2010/0134364 A1      Jun. 3, 2010

(30) Foreign Application Priority Data

Nov. 11, 2008   (JP) ................................. 2008-289269

(51) Int. Cl.
 *G01R 29/10*      (2006.01)
(52) U.S. Cl. ...................................................... 343/703
(58) Field of Classification Search .................. 343/703; 324/96

See application file for complete search history.

(56) References Cited

U.S. PATENT DOCUMENTS

| | | | |
|---|---|---|---|
| 5,532,704 | A | 7/1996 | Ruelle |
| 6,556,023 | B2 * | 4/2003 | Okazaki ........................ 324/637 |
| 2003/0050555 | A1 * | 3/2003 | Critchlow et al. ............ 600/420 |

FOREIGN PATENT DOCUMENTS

| | | |
|---|---|---|
| EP | 0629865 | 12/1994 |
| JP | 03-070379 | 3/1991 |
| JP | 06-027169 | 2/1994 |

OTHER PUBLICATIONS

European Search Report corresponding to European Serial No. 09014010.4 dated Apr. 1, 2010.
"Model 2175 MiniMast—User Manual" (on-line); Sep. 30, 2008, URL:http://www.ets.-lindgren.com/manuals/2175.

* cited by examiner

*Primary Examiner* — Jacob Y Choi
*Assistant Examiner* — Robert Karacsony
(74) *Attorney, Agent, or Firm* — SNR Denton US LLP

(57) ABSTRACT

An electromagnetic wave measuring apparatus includes: a reception antenna receiving an electromagnetic wave generated from an electronic apparatus placed at a predetermined distance away; an antenna mast holding the reception antenna; and a base portion fixing an end of the antenna mast vertically to a floor, the base portion having a flat bottom surface opposed to the floor, the bottom surface and the floor forming a gap of 2 mm or less therebetween and being capacitively coupled to each other. The base portion includes a mast-fixing portion having a height of 45 mm or less vertically to the floor and fixing the end of the antenna mast, a power portion being disposed at a position away from the reception antenna and generating power, and a power transmission portion transmitting the power generated by the power portion to the reception antenna and vertically moving the reception antenna along the antenna mast.

8 Claims, 33 Drawing Sheets

Use example of antenna positioner

Structure example of caster portion

Use example of antenna positioner

Internal structure example of antenna positioner base portion

33 First mast support portion

32 Pulley

External structure example of antenna positioner base portion when viewed from above Cross-sectional example of antenna positioner in related art Cross-sectional example of antenna positioner according to embodiment of present invention Cross-sectional example of antenna positioner base portion Structure example of caster portion Structure example of wheel Internal structure example of wheel Structure example of wheel Structure example of end of antenna positioner base portion Structure example of antenna mast fixed by second mast support portions Structure example of antenna mast fixed by fixing portions Structure example of antenna mast when viewed from above Structure example of antenna mast Structure example of antenna mast Example of impedance change with respect to frequency in antenna positioner Example of theoretical impedance change and change in measured EMI value with respect to separation distance between antenna positioner base portion and floor

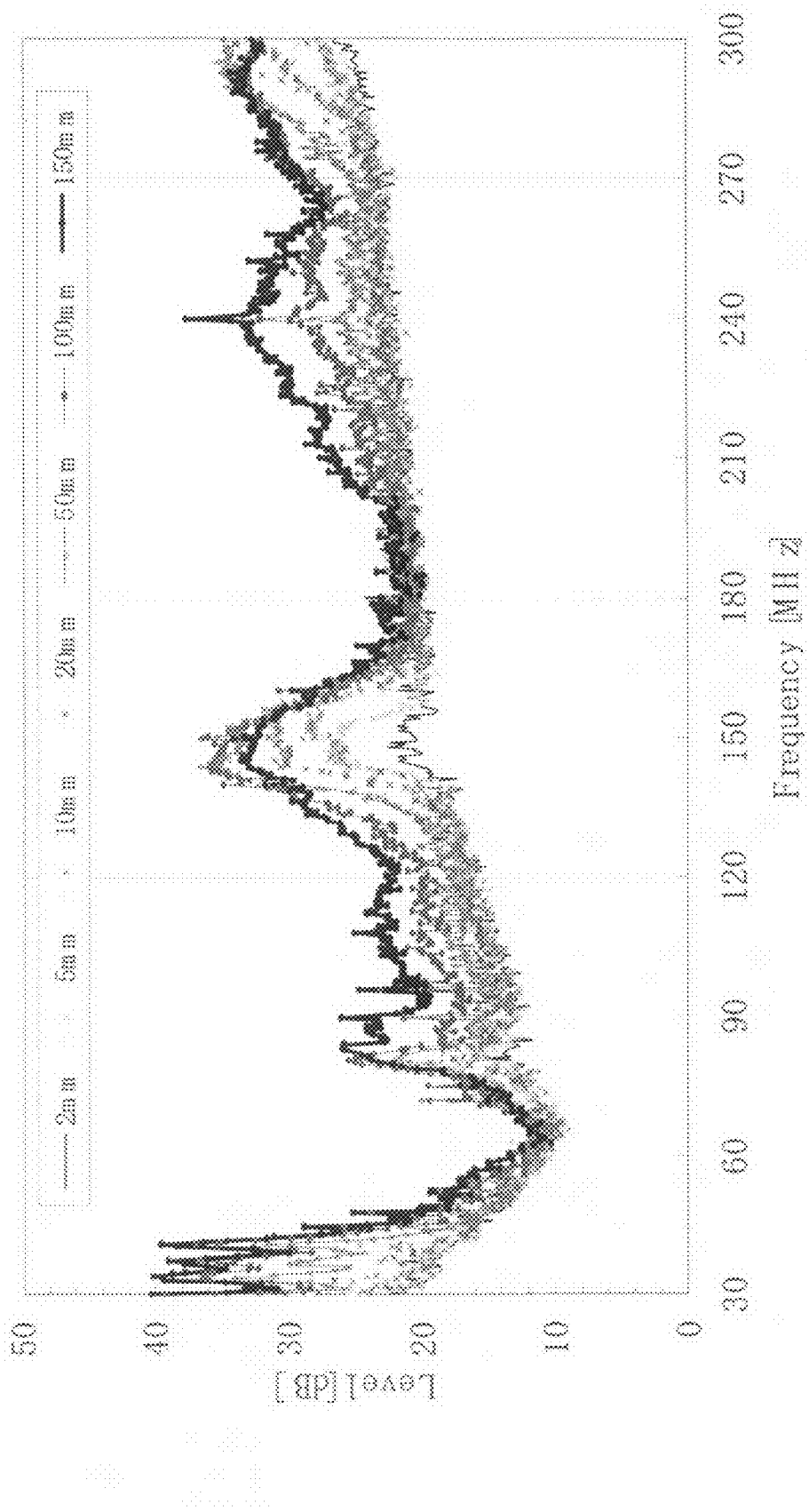
FIG.15A Example of EMI level when separation distance is changed to 2 to 150 mm

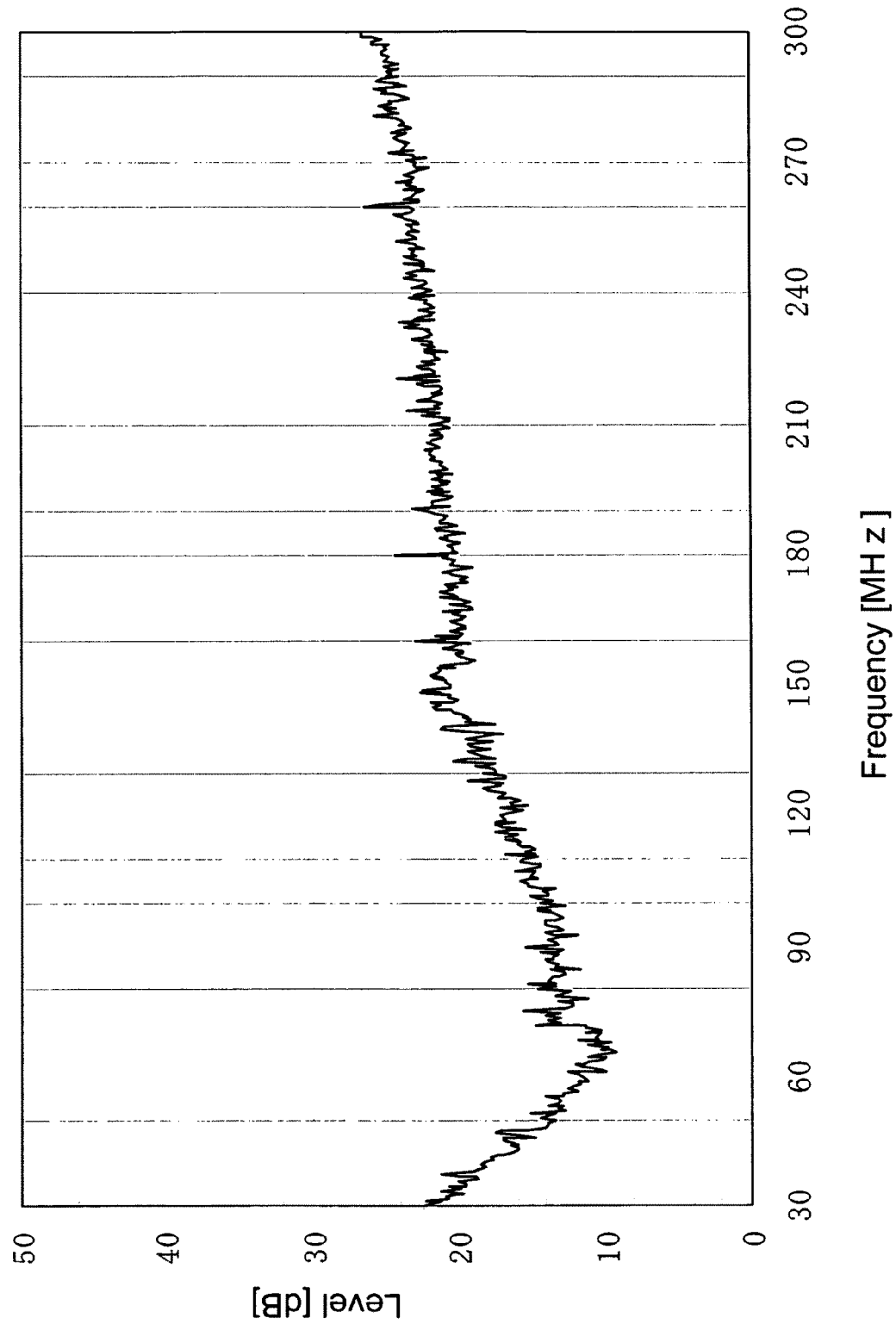
FIG.15B Case where separation distance is 2 mm

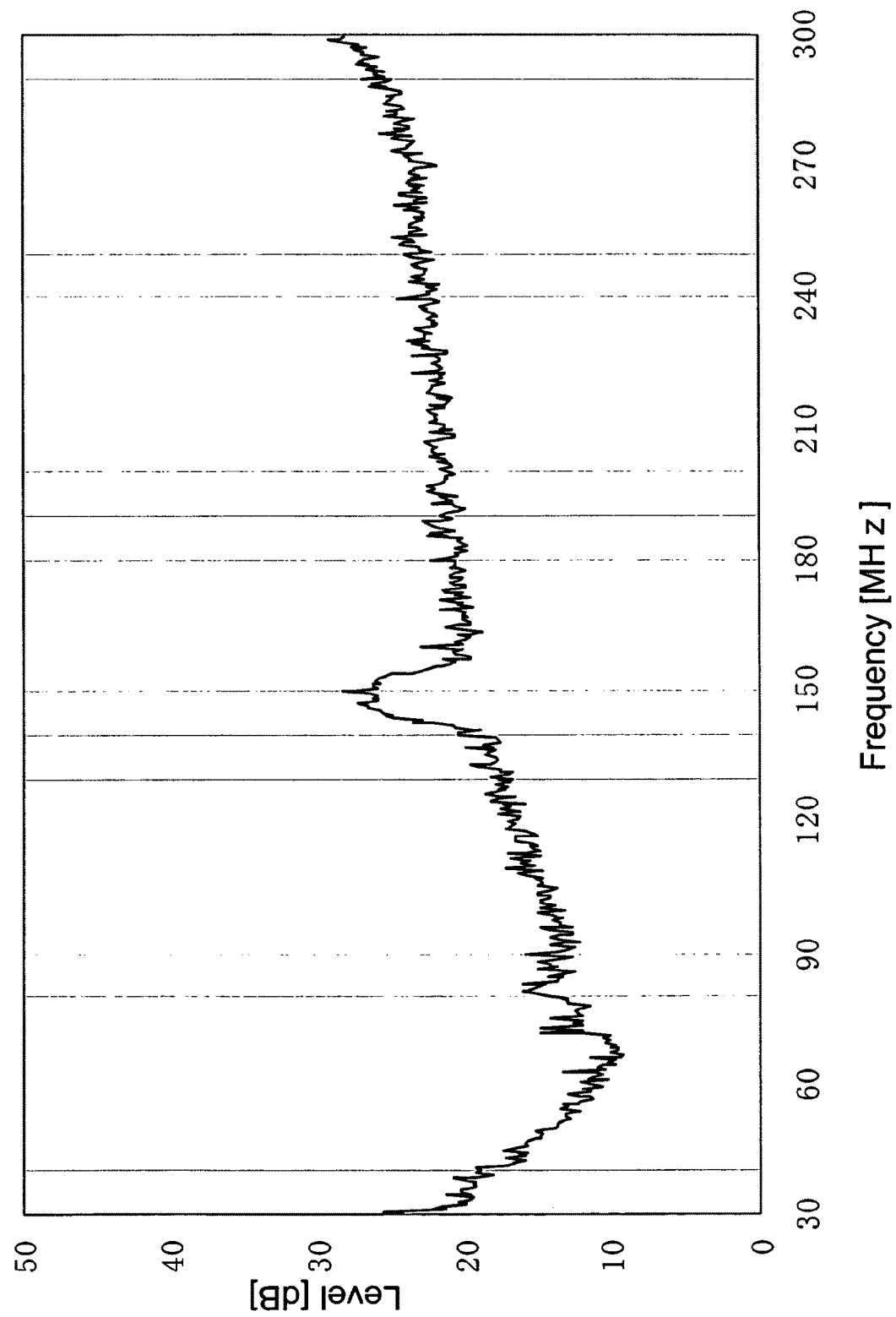
FIG.15C Case where separation distance is 5 mm

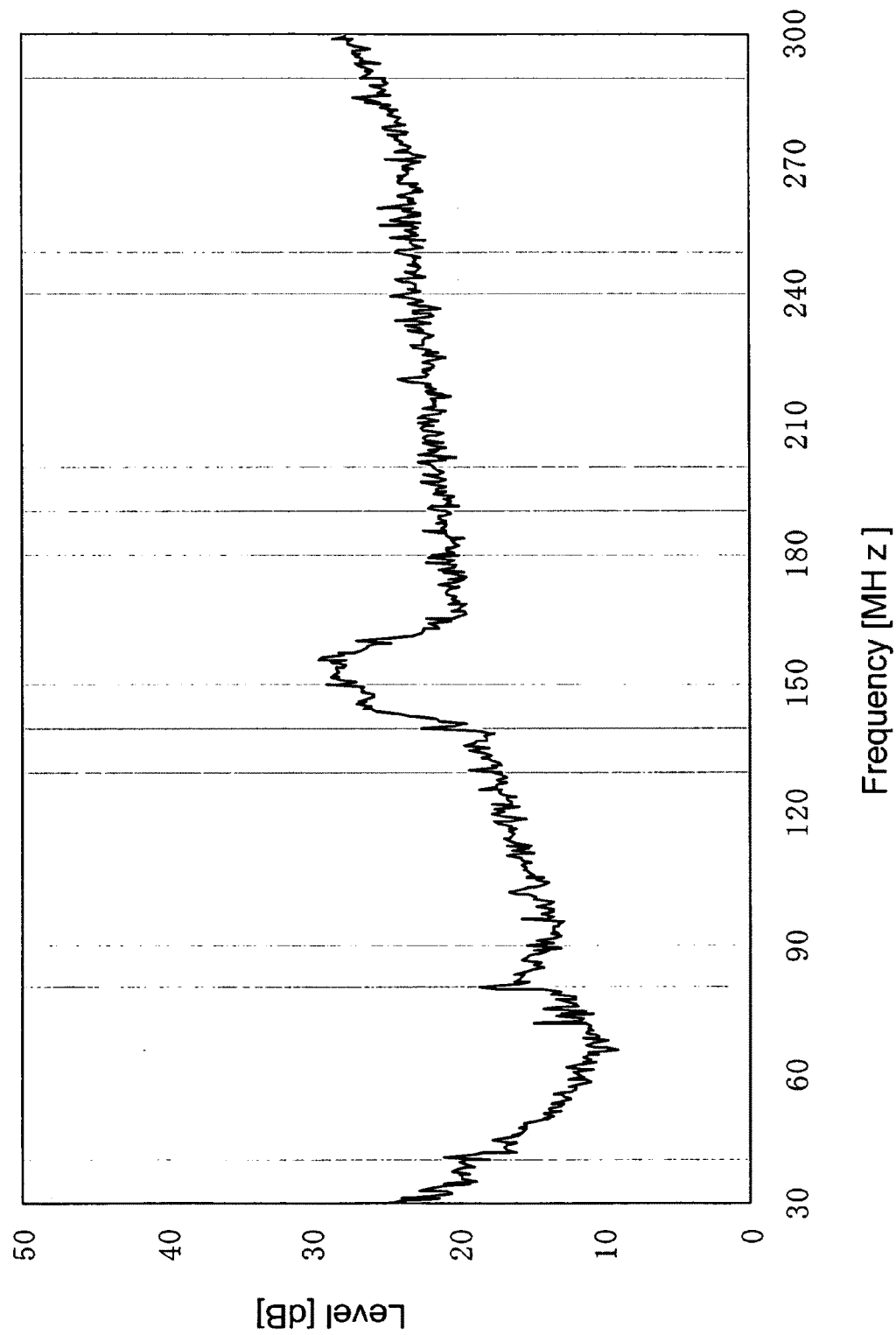
FIG.15D Case where separation distance is 10 mm

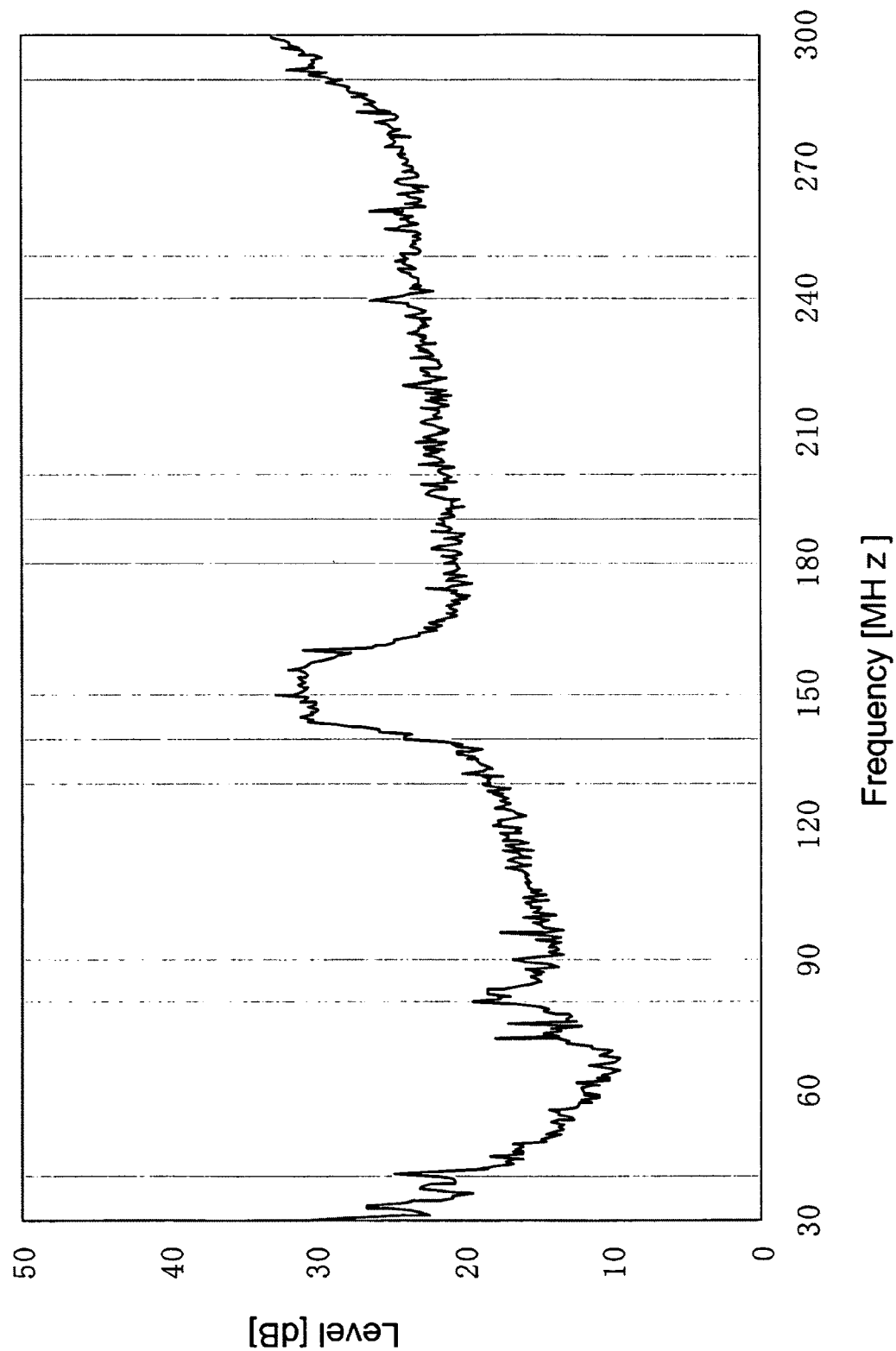
FIG.15E Case where separation distance is 20 mm

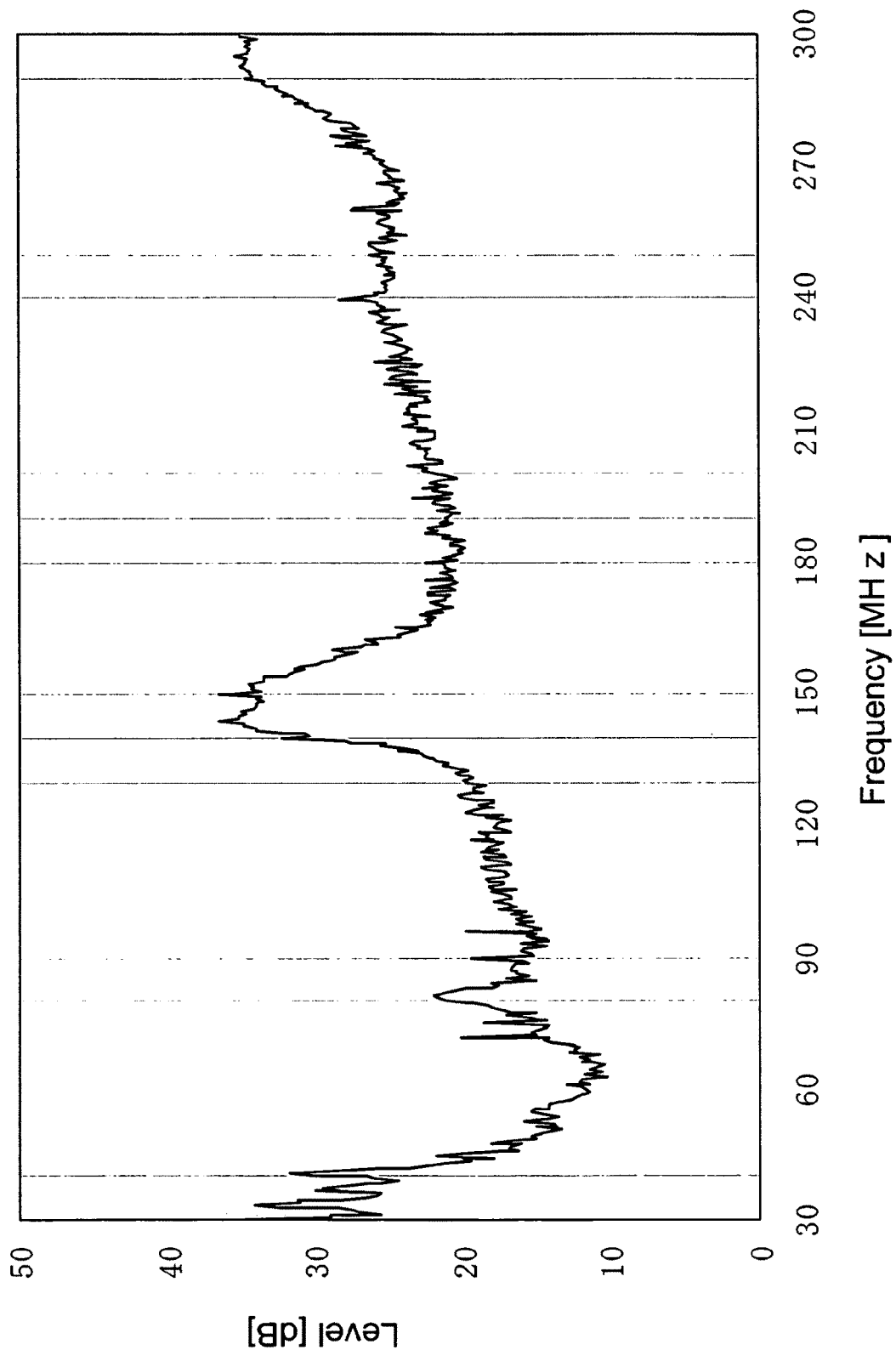
FIG.15F Case where separation distance is 50 mm

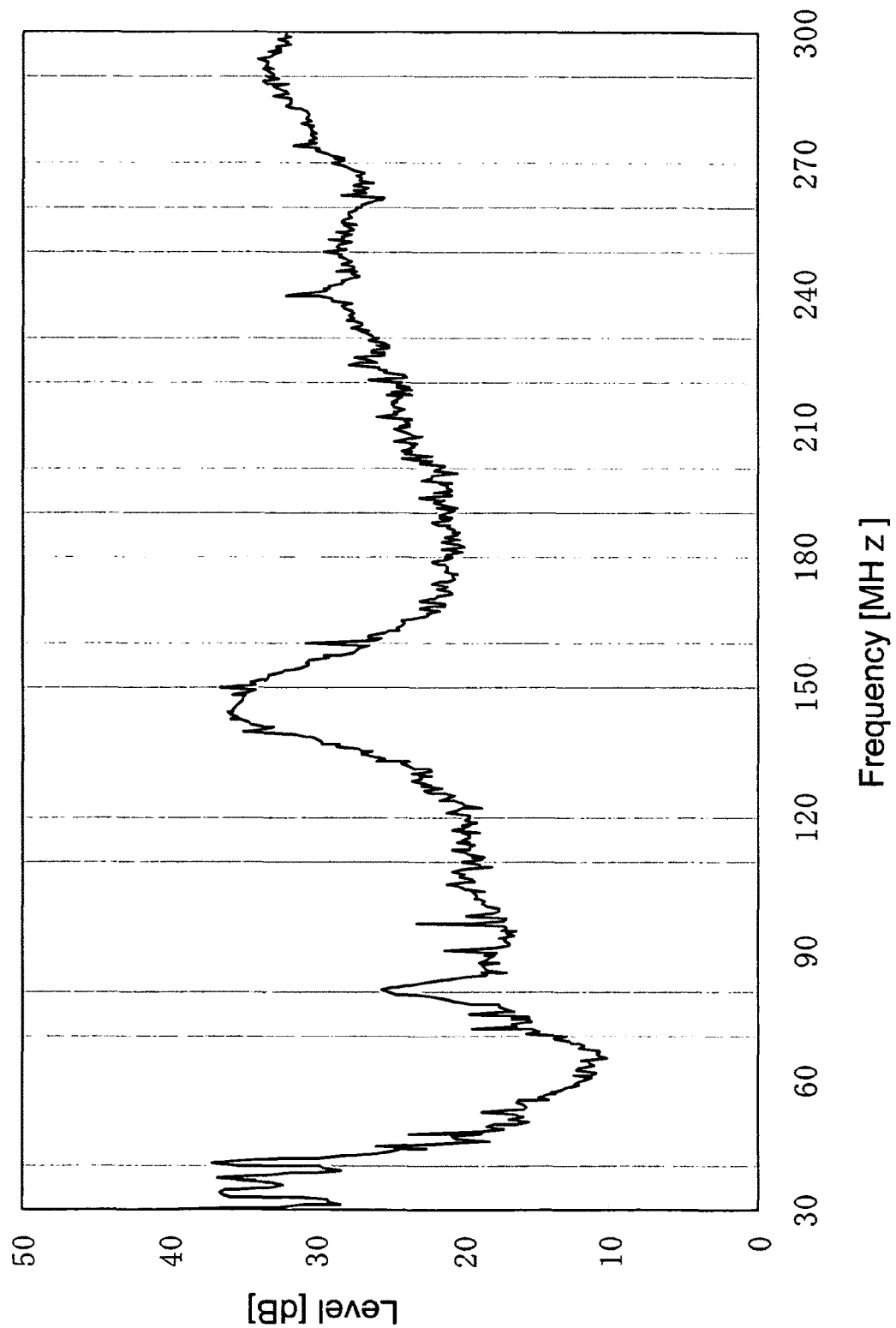
FIG.15G Case where separation distance is 100 mm

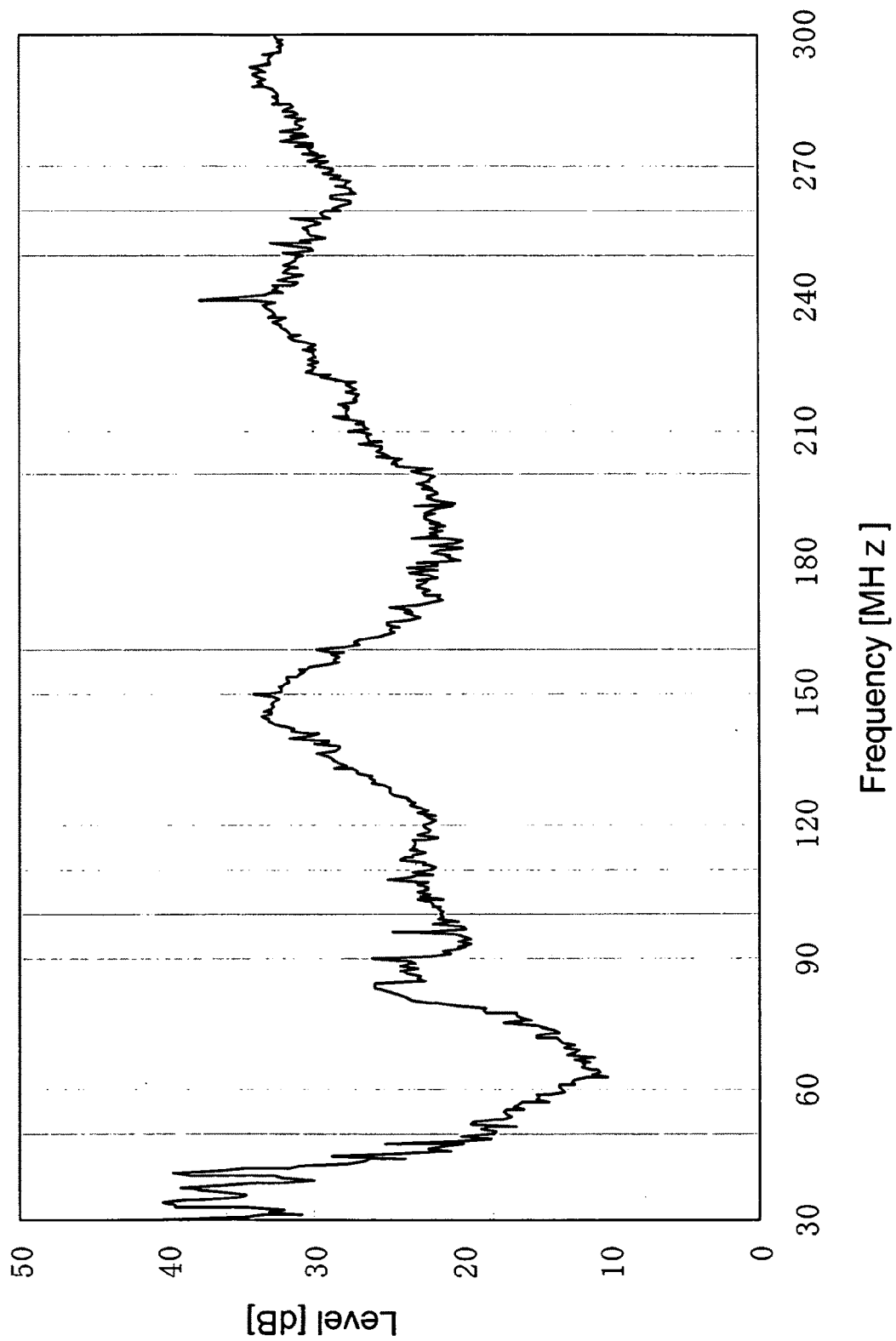
FIG.15H Case where separation distance is 150 mm

Structure example of floor

Structure example of antenna positioner base portion when viewed from above

Structure example of antenna positioner base portion when viewed in cross section

ELECTROMAGNETIC WAVE MEASURING APPARATUS

BACKGROUND OF THE INVENTION

1. Field of the Invention

The present invention relates to an electromagnetic wave measuring apparatus that is suitably applicable to, for example, a case of measuring EMI (Electromagnetic Interference) radiated from an electronic apparatus or the like.

2. Description of the Related Art

From the past, electromagnetic waves radiated from a clock oscillation circuit and the like included in many electronic apparatuses (for example, bundled products such as computer apparatus and recorder), for driving a CPU, a bus, an external memory, and the like, may become a cause of electromagnetic interference (EMI) that disturbs functions of other electronic apparatuses. Therefore, public institutions such as International Special Committee on Radio Interference and American National Standards Institute have established EMI industry standards. Further, government institutions such as Federal Communications Commission (hereinafter, abbreviated as FCC) regulate an EMI level of an electronic apparatus. Hereinafter, the International Special Committee on Radio Interference is abbreviated as CISPR, and the American National Standards Institute as ANSI.

Characteristics of EMI evaluation facilities (referring to open area test site and radio anechoic chamber) are obtained according to NSA (Normalized Site Attenuation) provided by CISPR, ANSI, and the like. At an EMI evaluation facility that meets a condition on a tolerance of an actual measured characteristic with respect to a theoretical value, the tolerance being within ±4 dB, together with various provisions such as GRP (Ground Reference Plane), a regulatory compliance evaluation for each country and control of electronic apparatuses mass-produced are performed. An EMI conformity evaluation is conducted by the following procedure. First, a height of a reception antenna is changed from 1 to 4 m in 360-degree directions of an electronic apparatus and a maximum value of a received electromagnetic wave is acquired. Next, an electric field intensity is calculated by correcting the acquired maximum value of the electromagnetic wave with antenna characteristics and loss of a coaxial cable. Then, it is verified that the electric field intensity falls within a range of predetermined limit values.

FIGS. 19 each show an example of an antenna positioner in related art as an example of an electromagnetic wave measuring apparatus that performs the EMI conformity evaluation.

FIG. 19A shows a first structure example of the antenna positioner in related art.

FIG. 19B shows a second structure example of the antenna positioner in related art.

FIG. 19C shows a third structure example of the antenna positioner in related art.

An antenna positioner $100a$ ($100b$, $100c$) used to measure an electromagnetic wave generated by an electronic apparatus (hereinafter, also referred to simply as EMI measurement) is installed in an EMI evaluation facility that is used at a time of the EMI conformity evaluation. The antenna positioner $100a$ ($100b$, $100c$) placed on a flat floor includes an antenna positioner base portion $103a$ ($103b$, $103c$) that is horizontally movable on the floor. Further, the antenna positioner $100a$ ($100b$, $100c$) includes an antenna mast $102a$ ($102b$, $102c$) that is installed in the antenna positioner base portion $103a$ ($103b$, $103c$) and supports a reception antenna $101a$ ($101b$, $101c$) that performs the EMI measurement. As the reception antenna $101a$ ($101b$, $101c$), various types of antennas are used in accordance with types of electronic apparatuses or electromagnetic waves to be measured.

When the antenna positioner base portion $103a$ ($103b$, $103c$) is stopped at a predetermined position, the reception antenna $101a$ ($101b$, $101c$) moves vertically to the floor along the antenna mast $102a$ ($102b$, $102c$). Then, the reception antenna $101a$ ($101b$, $101c$) is stopped at a desired height and measures an electromagnetic wave generated by the electronic apparatus.

Japanese Utility Model Application Laid-Open No. Hei 05-82117 discloses an antenna ascending/descending and turning apparatus that turns a reception antenna about a horizontal shaft thereof by only 90 degrees and ascends/descends the reception antenna to a necessary height.

Japanese Utility Model Application Laid-Open No. Hei 03-70379 discloses an antenna ascending/descending apparatus that ascends/descends and rotates an antenna and measures an electromagnetic wave.

SUMMARY OF THE INVENTION

Incidentally, in a case where the predetermined limit value that is required for the electronic apparatus or the like by the standards is exceeded, product designers repeat examination of EMI measures, implementation of EMI measures, and judgment on standards-compliance. Of those, the examination of EMI measures often relies on feeling and experiences of the product designers in general. In addition, since recent technologies in digital electronic apparatuses are diversified, fundamental waves and harmonics of a plurality of clock signals or digital transmission signals synchronized therewith tend to be superimposed complicatedly. Therefore, it has been difficult to identify a generation source of EMI and a transmission path.

On the other hand, in terms of an EMI evaluation facility, an EMI evaluation error is caused due to electrical interference (capacitive coupling, electromagnetic wave reflection, or EMI radiated by drive portion, its driver, and controller portion) with respect to a reception antenna of an antenna positioner used in the EMI evaluation facility.

For example, in a case where the height of the reception antenna $101a$ ($101b$, $101c$) is at about 1 m from the floor, a metal member such as a cover case and a mast support portion that supports the antenna mast may impart electrical interference to the reception antenna $101a$ ($101b$, $101c$). When the electrical interference is added, antenna characteristics (directivity, impedance, and the like) may be changed, resulting in a factor of the EMI evaluation error of the electronic apparatus.

Documents issued by CISPR (CISPR 16-1-4) define an antenna characteristic evaluation or a site in which an evaluation of EMI generated from an electronic apparatus is performed and show a concern for a point that an antenna positioner itself becomes a factor of an EMI evaluation error of an electronic apparatus. However, since a degree of electrical interference cannot be derived easily, the documents include qualitative descriptions.

General contents of CISPR 16-1-4 are as follows:

1. Use of a metallic substance for an antenna positioner is avoided to a maximum extent, thus avoiding electrical interference to a reception antenna;

2. A coaxial cable connected to the reception antenna is placed with a separation distance of at least 1 m or more, thus avoiding electrical interference to the reception antenna; and 3. Flatness of a floor (ground plane) is set to 45 mm or less, for example, when evaluation is performed at 1 GHz and a distance of 3 m.

Considering all the provisions 1 to 3 together, potential requirements with respect to a metal portion of the antenna positioner are suggested. In other words, the following points are suggested: a concavo-convex substance made of metal with a height exceeding at least 45 mm is eliminated from a range of 1 m from the reception antenna; and a state where interference of electromagnetic waves is negligible at a place away from the reception antenna by 1 m or more is desired.

However, when attentions are paid to an EMI-measure design technology for an electronic apparatus, problems of the antennal positioner constituting a part of the EMI evaluation facility are added to design problems involving rapid progress of a high-speed digital processing technology. This makes it difficult to optimize the EMI-measure design and reliably verify compliance with the regulation. As a result, negative impacts tend to be increased. Examples of the negative impacts include rising costs of the electronic apparatus due to excessive EMI measures, delay of development schedule due to increase of a load on the product designers, and restriction of functions of the electronic apparatus due to EMI measures.

Moreover, each of the antenna positioners in related art shown in FIGS. 19A to 19C has the center of gravity relatively high with respect to the floor, which lacks stability. Further, when a position of the reception antenna is set high, the antenna mast is liable to swing due to its own weight, which also lacks stability. Furthermore, many metal portions are exposed from the antenna positioner, a distance between the antenna positioner and the reception antenna is small, and an electromagnetic wave is caused between the antenna positioner and the floor made of metal. As a result, there is generated EMI other than an electromagnetic wave that is generated by the electronic apparatus as a measurement target, and the reception antenna receives the EMI, thus reducing accuracy of the EMI measurement of the electronic apparatus.

In the antenna positioner in related art, the height of the antenna positioner base portion with respect to the floor is approximately 100 mm. Therefore, in a case where a size of the antenna positioner base portion is 600 mm×1,000 mm, for example, an impedance with the floor is changed to 100Ω at 30 MHz and to 30Ω at 100 MHz. This change in impedance is obtained by a calculation with self-inductance being neglected. Thus, the antenna positioner base portion itself operates as a radiation antenna for EMI (approximately 30 to 300 MHz) generated by a power control portion such as a servo motor or its controller in some cases.

In view of the circumstances as described above, it is desirable to prevent an electromagnetic wave generated by an electromagnetic wave measuring apparatus itself from affecting an EMI measurement when the EMI measurement of an electronic apparatus is performed.

According to an embodiment of the present invention, there is provided an electromagnetic wave measuring apparatus including a reception antenna to receive an electromagnetic wave generated from an electronic apparatus placed at a predetermined distance away, and an antenna mast to hold the reception antenna.

Further, the electromagnetic wave measuring apparatus includes a base portion to fix an end of the antenna mast in a vertical direction with respect to a floor, the base portion having a flat bottom surface opposed to the floor, the bottom surface and the floor forming a gap of 2 mm or less therebetween and being capacitively coupled to each other.

The base portion includes a mast-fixing portion that has a height of 45 mm or less in the vertical direction with respect to the floor and fixes the end of the antenna mast, and a power portion that is disposed at a position away from the reception antenna and generates power.

Further, the base portion includes a power transmission portion that transmits the power generated by the power portion to the reception antenna and vertically moves the reception antenna along the antenna mast.

With this structure, by the base portion that is capacitively coupled to the floor, an unnecessary electromagnetic wave such as EMI (approximately 30 to 300 MHz) generated from the power portion and the like is prevented from being radiated.

According to the embodiment of the present invention, by appropriately shielding circumferences of the power portion and the like included in the electromagnetic wave measuring apparatus, it is possible to perform the EMI measurement of the electronic apparatus while suppressing influence of the electromagnetic wave generated by the electromagnetic wave measuring apparatus itself. In this case, a thickness of the base portion is considered to be the same as an asperity tolerance range with respect to the floor, the asperity tolerance range being provided by the standards, because a gap between the floor and the flat bottom surface opposed to the floor is set to 2 mm or less. Further, the mast-fixing portion is formed to have a height of 45 mm or less vertical to the floor and is considered to be the same as the floor, with the result that there is an effect that the EMI measurement of the electronic apparatus is not affected.

These and other objects, features and advantages of the present invention will become more apparent in light of the following detailed description of best mode embodiments thereof, as illustrated in the accompanying drawings.

BRIEF DESCRIPTION OF DRAWINGS

FIGS. 15A to 15H are explanatory diagrams each showing an example of an EMI level in a case where the separation distance according to the first embodiment of the present invention is changed;

DESCRIPTION OF PREFERRED EMBODIMENTS

Hereinafter, best modes (hereinafter, referred to as embodiments) of the present invention will be described with reference to the drawings. It should be noted that descriptions will be made in the following order.

1. First Embodiment (use example and structure example of antenna positioner)
2. Second Embodiment (example of thinning of antenna positioner base portion and lowering of center of gravity thereof)
3. Third Embodiment (example of EMI suppression from power portion, power control portion, and controller)
4. Modified Example (1. First Embodiment)

(Use Example and Structure Example of Antenna Positioner)

First, a first embodiment of the present invention will be described with reference to FIGS. 1 to 15.

In this embodiment, there will be described an example in which the present invention is applied to an antenna positioner 1 as an electromagnetic wave measuring apparatus for measuring electro-magnetic interference (EMI) radiated from an electronic apparatus (bundled product) and the like. In this example, the electronic apparatus that is subjected to an EMI measurement and the antenna positioner 1 are placed within an EMI evaluation facility.

Figure 1:
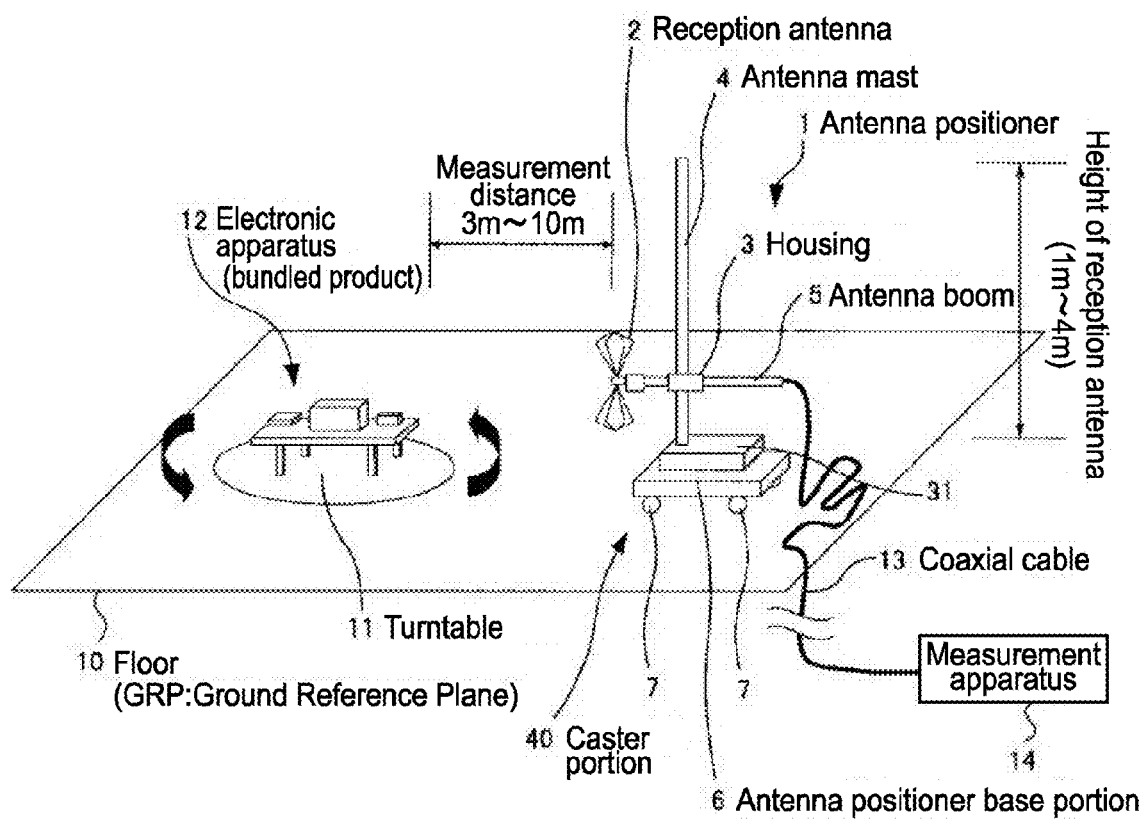
FIG. 1 is a structure diagram showing a use example of an antenna positioner according to a first embodiment of the present invention.

FIG. 1 shows a use example of the antenna positioner 1 of this example.

The antenna positioner 1 placed on a floor 10 called GRP includes a reception antenna 2 that measures an electromagnetic wave generated by an electronic apparatus 12 and an antenna mast 4 that holds the reception antenna 2 so as to be movable in a vertical direction. The antenna positioner 1 further includes an antenna positioner base portion 6 that fixes one end of the antenna mast 4. The antenna mast 4 is provided with a housing 3 for fixing the reception antenna 2, and the housing 3 supports an antenna boom 5 that can move the reception antenna 2 horizontally with respect to the floor 10.

The reception antenna 2 receives an electromagnetic wave generated from the electronic apparatus 12 that is placed a predetermined distance away therefrom. The electromagnetic wave received by the reception antenna 2 mainly includes EMI. A height of the reception antenna 2 is variable by the antenna positioner 1. Because the antenna mast 4 has a length of 4 m or more, the reception antenna 2 is movable in a range of 1 m to 4 m vertically to the floor 10.

A measurement distance between the antenna positioner 1 and the electronic apparatus 12 is in a range of 3 m to 10 m. The electronic apparatus 12 is placed on a turntable 11 formed on the floor 10. The turntable 11 is rotatable in clockwise and counter-clockwise directions, facing the floor 10. Therefore, the electronic apparatus 12 as an EMI measurement target placed on the turntable 11 is also rotated in the clockwise and counter-clockwise directions, facing the floor 10.

When the height of the reception antenna 2 is changed, the antenna mast 4 may swing in some cases. In order to suppress the swing of the antenna mast 4, it is necessary to provide a support portion having a certain strength at a portion in which the antenna mast 4 and the antenna positioner base portion 6 are joined. Generally, a processed material made of metal is used for the support portion.

The antenna positioner base portion 6 in this example includes a first mast support portion 33 and second mast support portions 61 that fix one end of the antenna mast 4 vertically with respect to the floor 10 on which the antenna positioner 1 is placed (see FIGS. 10 and 11 to be described later). The first mast support portion 33 and the second mast support portions 61 are each formed so as to have a height of 45 mm or less in a vertical direction with respect to the floor 10. Further, a gap between the floor 10 and a flat bottom surface of the antenna positioner base portion 6 is set to 2 mm or less, and the antenna positioner base portion 6 is capacitively coupled to the floor 10.

The antenna positioner base portion 6 includes a caster portion 40 that moves horizontally with respect to the floor 10 (see FIGS. 6 and 7 to be described later). The caster portion 40 includes wheels 7 that are formed of a material having lower conductivity than that of metal. The caster portion 40 is rotatable in an arbitrary direction and can move the antenna positioner 1 in a direction to which the caster portion 40 turns.

The antenna boom 5 includes a coaxial cable 13. A measurement apparatus 14 placed at a position where there is no influence on the EMI measurement performs an EMI analysis or the like based on EMI measurement data of the reception antenna 2, which is received via the coaxial cable 13 drawn from the antenna boom 5. The antenna positioner base portion 6 includes a cover case 31 for covering circumferences of portions that may become generation sources of EMI.

(Internal Structure Example of Antenna Positioner Base Portion)

Figure 2:
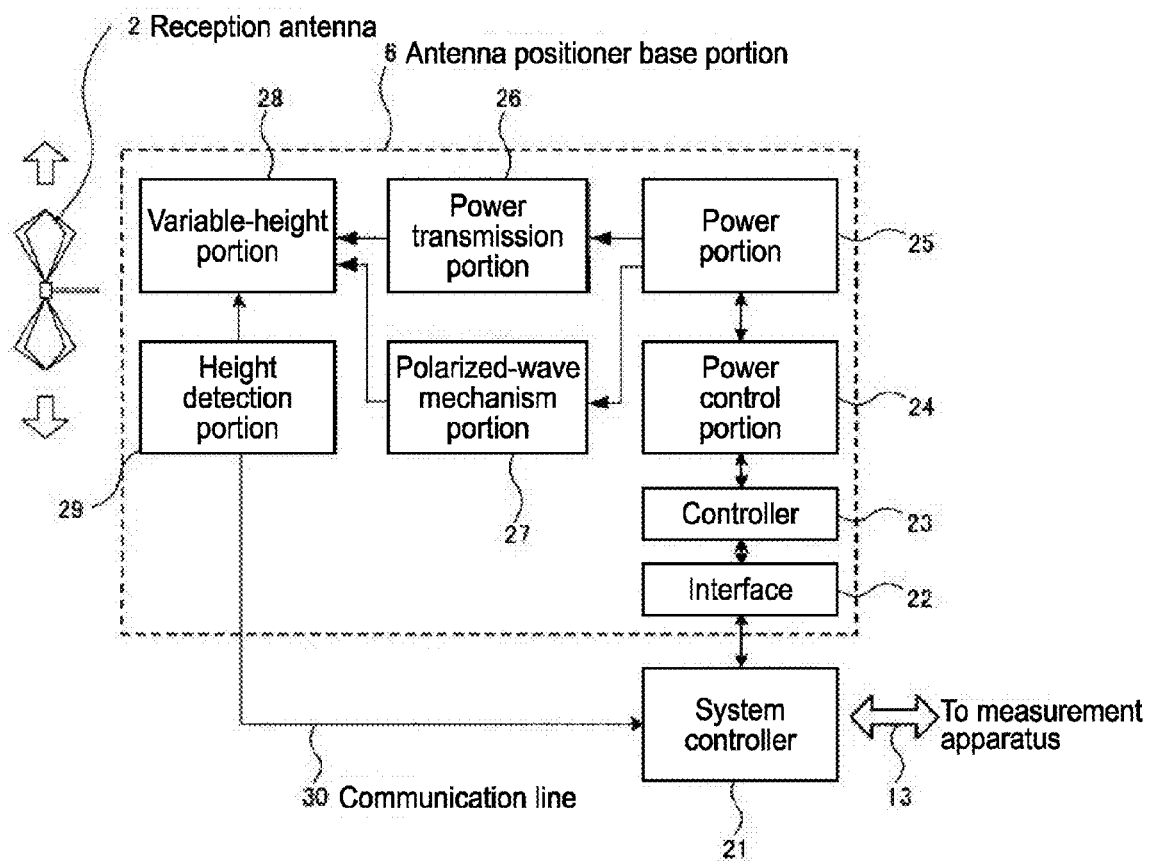
FIG. 2 is a block diagram showing an internal structure example of an antenna positioner base portion according to the first embodiment of the present invention.

FIG. 2 shows an internal structure example of the antenna positioner base portion 6.

The antenna positioner base portion 6 includes a power portion 25 that generates power at predetermined revolutions and a power control portion 24 that controls drive of the power portion 25 (for example, revolutions). Further, the antenna positioner base portion 6 includes a system controller 21 that detects the current height of the reception antenna 2 and gives an instruction to move the reception antenna 2 to a target height by issuing a control command. Moreover, the antenna positioner base portion 6 includes an interface 22 that receives the control command from the system controller 21 and a controller 23 that gives an operation instruction to the power control portion 24 based on the control command received by the interface 22. For example, a servo motor is used as the power portion 25 and a servo motor driver is used as the power control portion 24. The controller 23, the power control portion 24, and the power portion 25 are arranged in positions away from the reception antenna 2.

Further, the antenna positioner base portion 6 includes a power transmission portion 26 that transmits power generated by the power portion 25 to the reception antenna 2 and vertically moves the reception antenna 2 along the antenna mast 4. For the power transmission portion 26, for example, a torque converter or a metal gear wheel with a small mechanical displacement is used. The antenna positioner base portion 6 further includes a variable-height portion 28 that changes the height of the reception antenna 2. A pulley or a timing belt is used as the variable-height portion 28, for example. Moreover, the antenna positioner base portion 6 includes a height detection portion 29 that detects the height of the reception antenna 2. For the height detection portion 29, for example, a rotary encoder is used. The height detection portion 29 and the system controller 21 are connected via a communication line 30. For example, an optical fiber is used for the communication line 30 and it is possible to transmit control information at high-speed while suppressing generation of EMI. Accordingly, it is possible to suppress generation and transmission of the EMI that accompany the communication via the communication line 30. The height of the reception antenna 2 detected by the height detection portion 29 is transmitted to the system controller 21 as needed.

The system controller 21 controls operations of the respective portions in accordance with height information of the reception antenna 2, the height information being received from the height detection portion 29, and controls the reception antenna 2 to be at a target height. As described above, feedback control is performed between the antenna positioner base portion 6 and the system controller 21.

When the antenna positioner 1 is structured, use of a metal member should be avoided as much as possible within a range of 1 m from the reception antenna 2. For example, a ceramic bearing or the like is used for a roller (not shown) included in the housing 3 that supports the antenna boom 5 or a rotary portion of a support portion or the like that receives a load of a timing belt included in the variable-height portion 28. With this structure, it is possible to suppress electrical interference with respect to EMI of the electronic apparatus 12, which is received by the reception antenna 2, while suppressing generation of unnecessary EMI.

In an EMI evaluation according to EMI regulations, it is necessary to prove that results of both a horizontally-polarized wave and a vertically-polarized wave meet the standards. For that reason, the antenna positioner base portion 6 may be provided with a polarized-wave mechanism portion 27 in view of enhancement of a working efficiency. For example, an electromagnetic clutch is used for the polarized-wave mechanism portion 27. The polarized-wave mechanism portion 27 has a function of transmitting power supplied from the power portion 25 to the variable-height portion 28. The variable-height portion 28 includes a variable-angle portion (not shown) that changes an angle of the reception antenna 2 with respect to the floor 10. Then, by an action of the variable-angle portion, the angle of the reception antenna 2 is changed and a polarized wave can be detected.

According to FCC regulations provided by FCC (Federal Communications Commission), the antenna positioner 1 needs to perform the EMI evaluation by EMI measurements in a range up to 40 GHz at a maximum. In general, as a frequency of a voltage applied to the electronic apparatus 12 becomes higher, strength and weakness (height pattern) of a reception level that is generated due to interference between phases of a direct wave of EMI radiated from the electronic apparatus 12 and a reflected wave from the floor 10 become fine. As a result, only by changing the height of the reception antenna 2 by several cm, Peak (direct wave and reflected wave in phase) and Null (direct wave and reflected wave in reverse phase) are observed.

Therefore, it is required to accurately detect that phases of the EMI and the reflected wave are changed into in-phase or reverse phases and accurately respond thereto, and it is necessary to enhance resolution of the reception antenna 2 in the height direction. In this example, by using, for example, a torque converter or a gear wheel with a small mechanical displacement for the power transmission portion 26, the resolution of the reception antenna 2 in the height direction is enhanced. It should be noted that in order to further enhance accuracy of a position detection of the reception antenna 2 in the height direction, there is a case where a rotary encoder or the like separate from the controller 23 is installed and its position detection information is used.

Further, because the EMI radiated from the power portion 25, the power control portion 24, and the controller 23 themselves are intense, there may by a case where the EMI evaluation of the electronic apparatus 12 is adversely affected. For that reason, a circumference of the antenna positioner base portion 6 is covered with a shielding portion. Specifically, by covering the power portion 25, the power control portion 24, and the controller 23 with a cover case 31 made of metal, the EMI radiated from the apparatus itself is shielded. With this structure, an EMI evaluation error caused by the antenna positioner 1 itself can be suppressed.

Figure 3A:
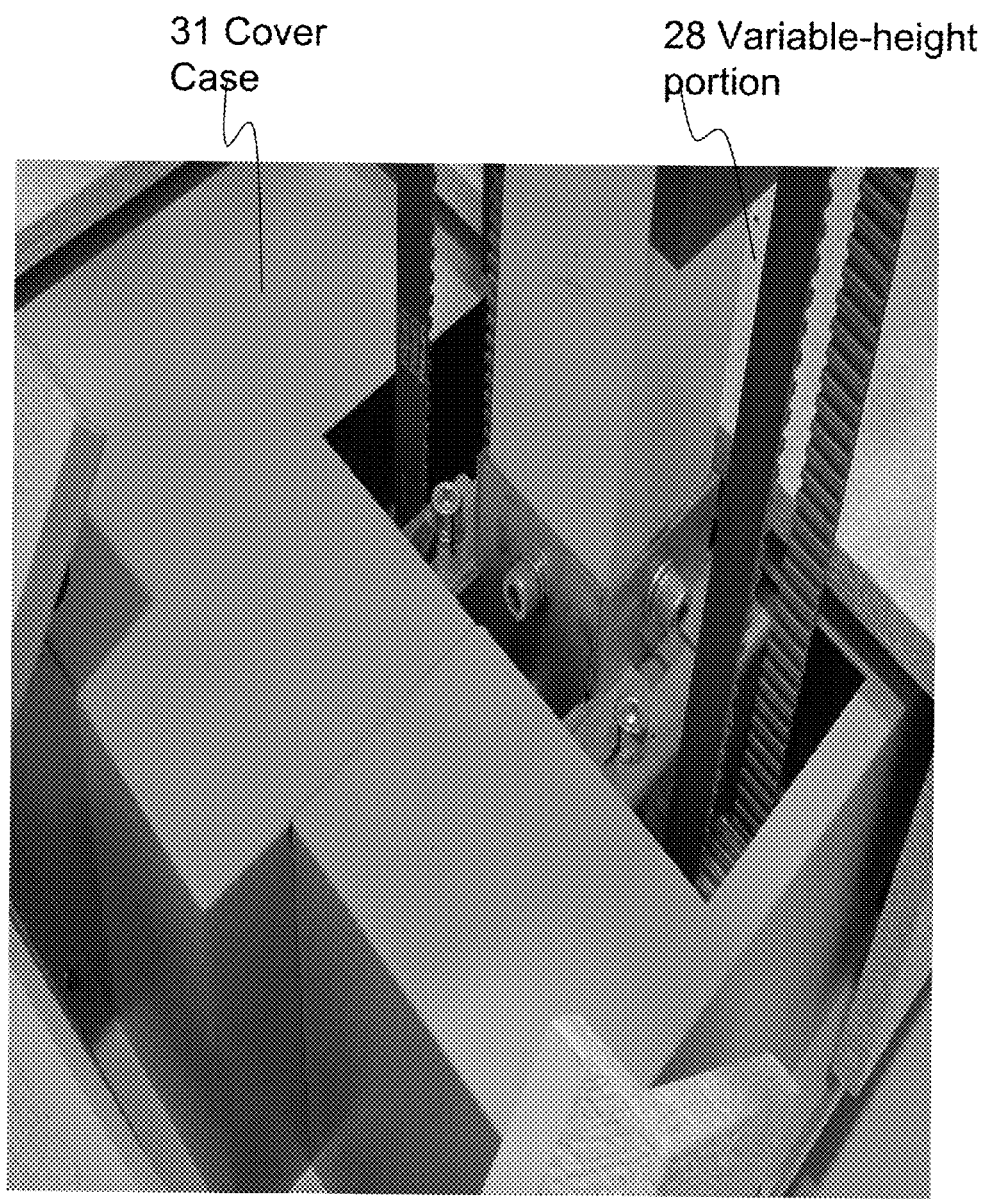
FIGS. 3A to 3C are explanatory views each showing the internal structure example of the antenna positioner base portion according to the first embodiment of the present invention.
Figure 3B:
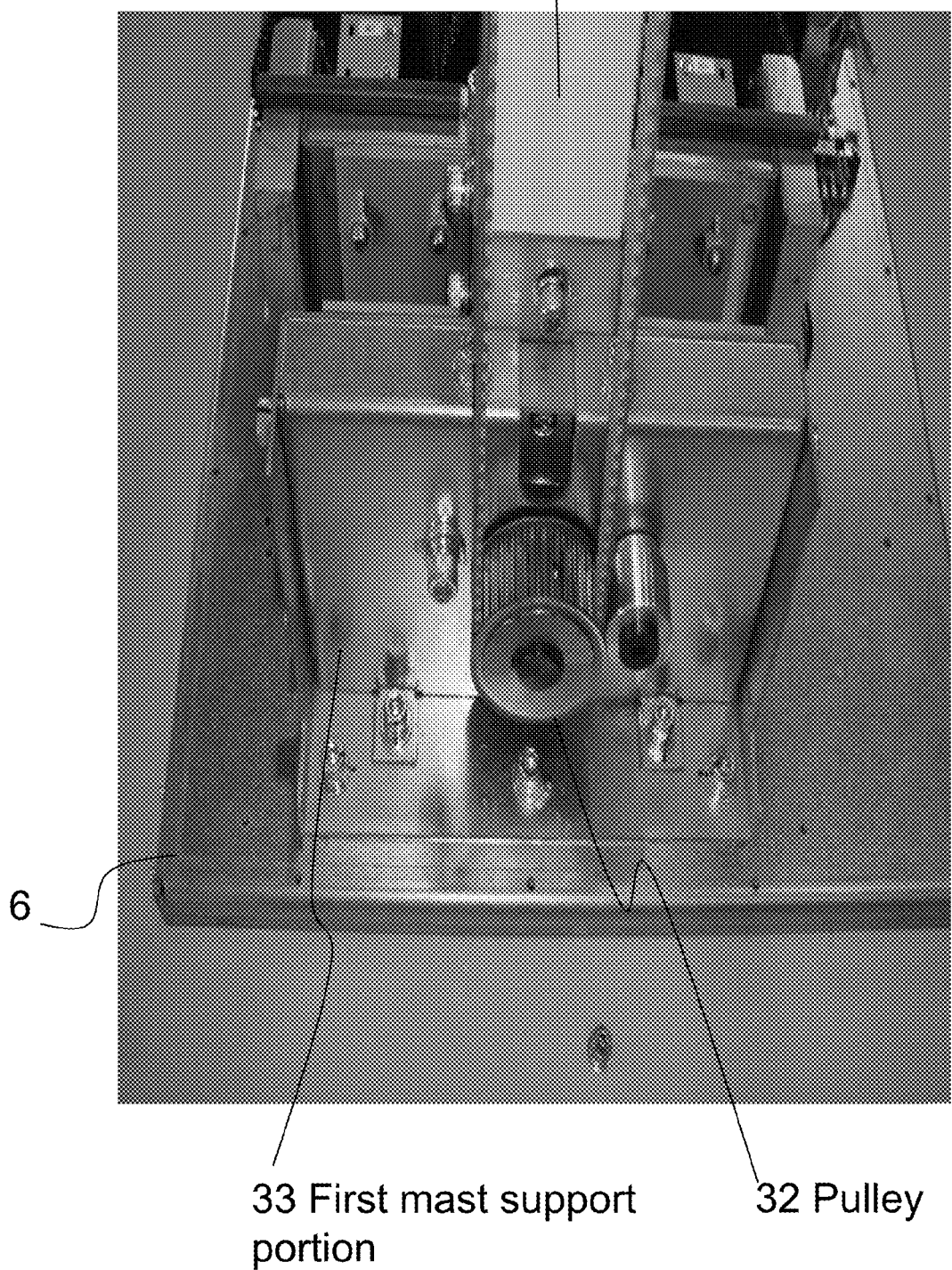
Figure 3C:
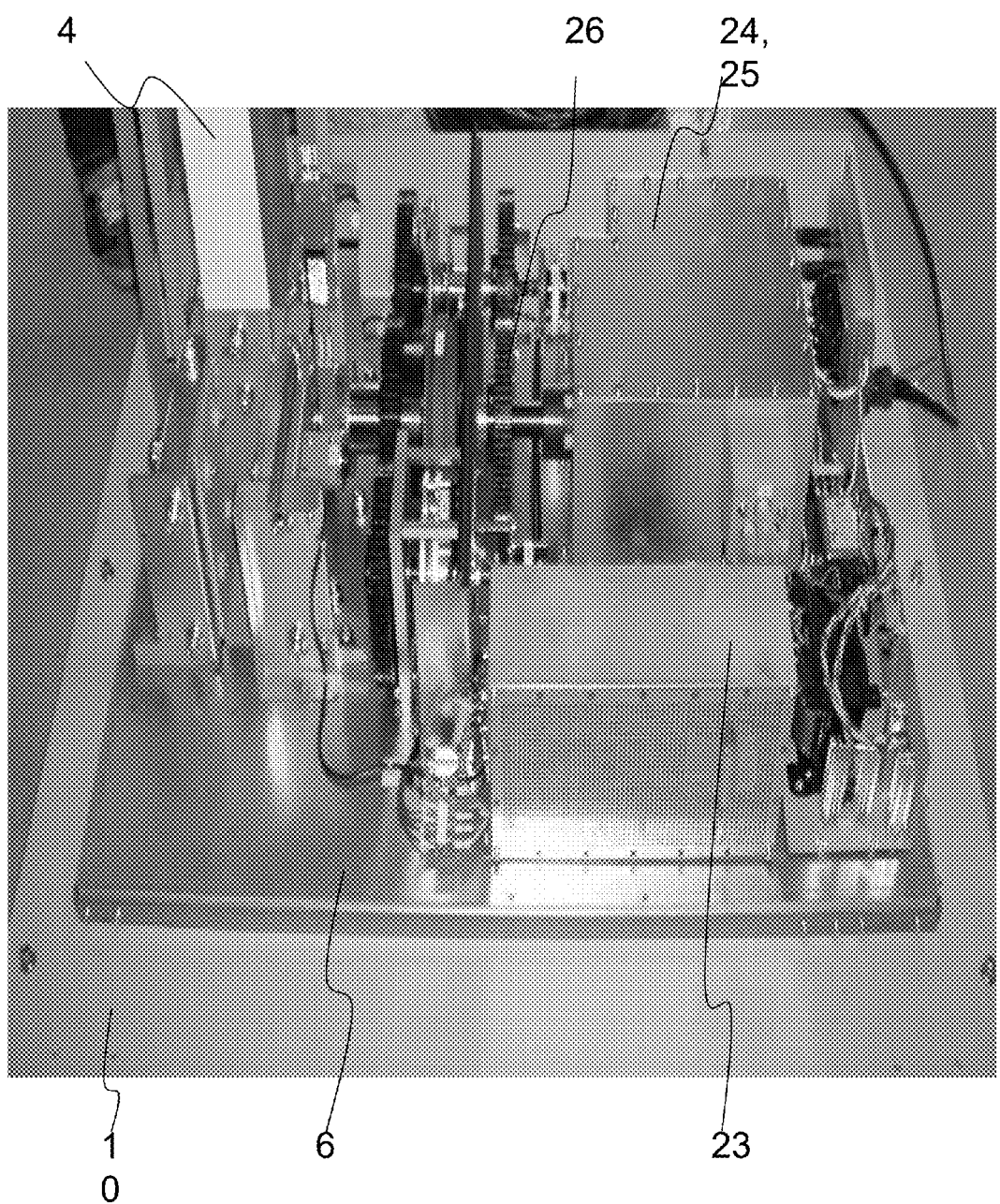

FIGS. 3A to 3C each show a structure example of the antenna positioner base portion 6.

FIG. 3A shows a structure example of the antenna positioner base portion 6 covered with the cover case 31.

The controller 23, the power control portion 24, the power portion 25, and the power transmission portion 26 are completely covered with the cover case 31 made of metal.

FIG. 3B shows a structure example of the antenna positioner base portion 6 from which the cover case 31 is removed.

In the antenna positioner base portion 6, a pulley 32 is installed as an example of the power transmission portion 26. Further, in the vicinity of the center of the antenna positioner base portion 6, the first mast support portion 33 for supporting the antenna mast 4 in two directions is installed. The antenna mast 4 and the first mast support portion 33 are fixed to the antenna positioner base portion 6 by bolts, nuts, and the like. This state will be described later with reference to FIGS. 10 and 11.

FIG. 3C shows an overall structure example of the antenna positioner base portion 6 from which the cover case 31 is removed.

The controller 23, the power control portion 24, the power portion 25, and the power transmission portion 26 are installed on the antenna positioner base portion 6. The height of the antenna positioner base portion 6 with respect to the floor 10 is formed so that the respective portions excluding at least the first mast support portion 33 have thicknesses as thinner as possible (within 10 mm) in a vertical direction with respect to the floor 10. With this structure, the center of gravity of the antenna positioner base portion 6 is lowered.

(Thinning of Antenna Positioner Base Portion and Lowering of Center of Gravity Thereof)

Two structure examples of the antenna positioner base portion 6 are roughly conceivable.

A first structure example is a case where the antenna positioner base portion 6 is formed of one metal plate. In this case, the antenna positioner base portion 6 is formed of stainless steel having a thickness of 10 mm or less (for example, SUS304), with which torsional rigidity can be increased.

A second structure example is a case where the antenna positioner base portion 6 is formed by combining a plurality of metal plates. In this case, the antenna positioner base portion 6 is formed as a structure obtained by welding the metal plates each having a thickness of about 2 to 3 mm in a grid manner. Alternatively, the antenna positioner base portion 6 is formed by welding a steel plate having a thickness of about 1 to 2 mm as a bottom plate to a structure to which a rectangular column or the like having a thickness of about 1 m is welded. With such a structure as well, torsional rigidity of the antenna positioner base portion 6 can be increased.

With any of the structure examples, as long as the thickness of the antenna positioner base portion 6 is falls within 10 mm, the range is considered to be the same as an asperity tolerance range with respect to the floor 10 (GRP), the asperity tolerance range being provided by the standards.

Figure 4:
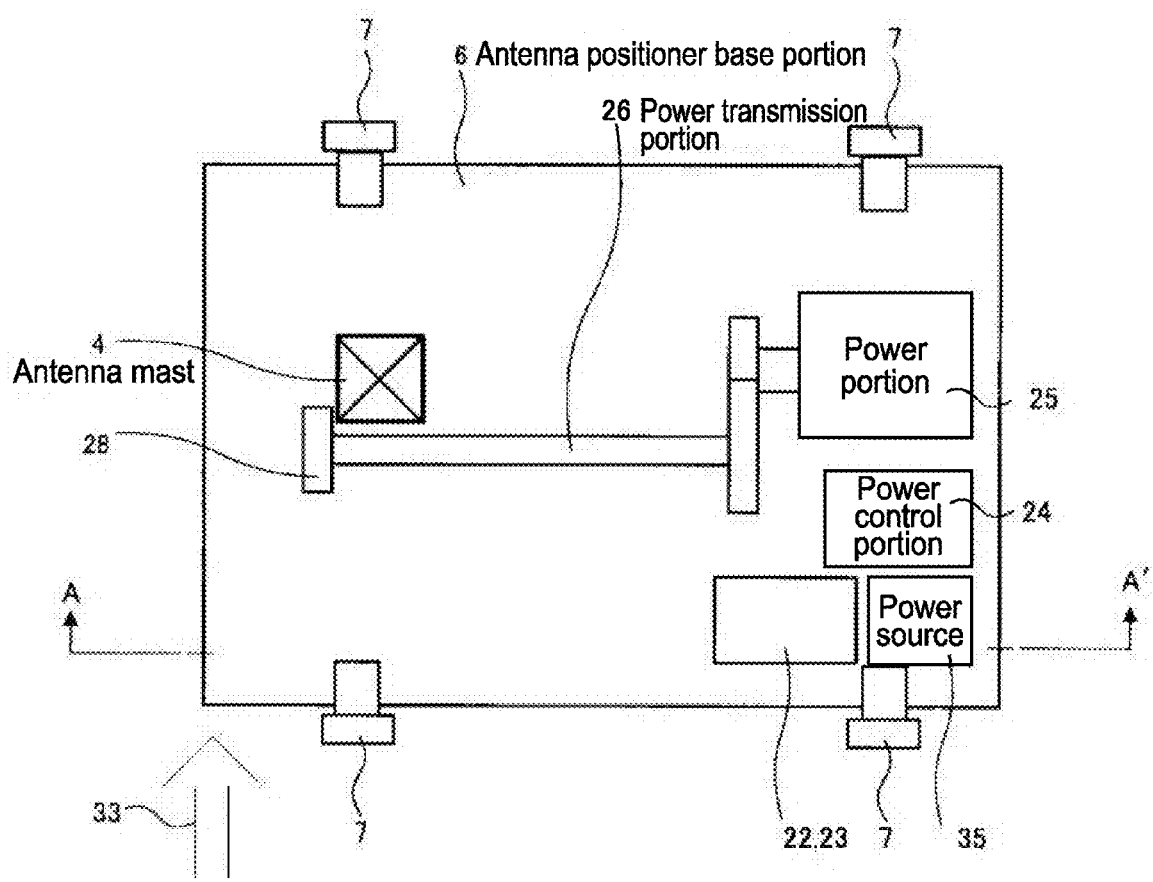
FIG. 4 is an explanatory diagram showing an external structure example of the antenna positioner base portion according to the first embodiment of the present invention when viewed from above.

FIG. 4 shows an external structure example of the antenna positioner base portion 6 when viewed from above. A basic structure of the antenna positioner base portion 6 is the same as that described with reference to FIGS. 2 and 3. It should be noted that illustration of the height detection portion 29 and the communication line 30 is omitted.

Installed in the antenna positioner base portion 6 are the antenna mast 4, the interface 22, the controller 23, the power control portion 24, the power portion 25, the power transmission portion 26, and the like. Further, a power source 35 for supplying power to the controller 23, the power control portion 24, and the power portion 25 is installed in the antenna positioner base portion 6. By the power supplied from the power source 35, the interface 22, the controller 23, the power control portion 24, the power portion 25, and the power transmission portion 26 operate. The power transmission portion 26 drives the variable-height portion 28 and the reception antenna 2 moves vertically along the antenna mast 4.

It should be noted that the thickness of the antenna positioner base portion 6 is necessary to be adjusted in accordance with an attachment structure of the first mast support portion 33 that supports the antenna mast 4. Here, as to a metal member of an attachment portion, an upper limit of the height thereof with respect to the floor 10 is defined to be 45 mm. This is a value compliant with the standards of CISPR 16-1-4.

In this case, a size of the antenna positioner base portion 6 is assumed to be about 600 mm×1,000 mm. One reason the antenna positioner base portion 6 is set to have such a size is to ensure stability in a case where the antenna boom 5 is intended to be made longer. In a case where an area of the antenna positioner base portion 6 needs to be made larger, it is desired to enhance rigidity by fastening a steel plate for reinforcement with screws onto an upper surface of the antenna positioner base portion 6.

(Thinning of Antenna Positioner Base Portion and Lowering of Center of Gravity Thereof)

Incidentally, as a precondition for thinning the antenna positioner base portion 6 of this example and lowering the center of gravity of the antenna positioner base portion 6, it is necessary that the floor 10 should be sufficiently flat around a position where the antenna positioner 1 is placed. Here, with reference to FIGS. 5A and 5B in which antenna positioners are viewed in cross section, differences therebetween will be described by comparing a structure of an antenna positioner 100 in related art with that of the antenna positioner 1 according to this embodiment.

Figure 5A:
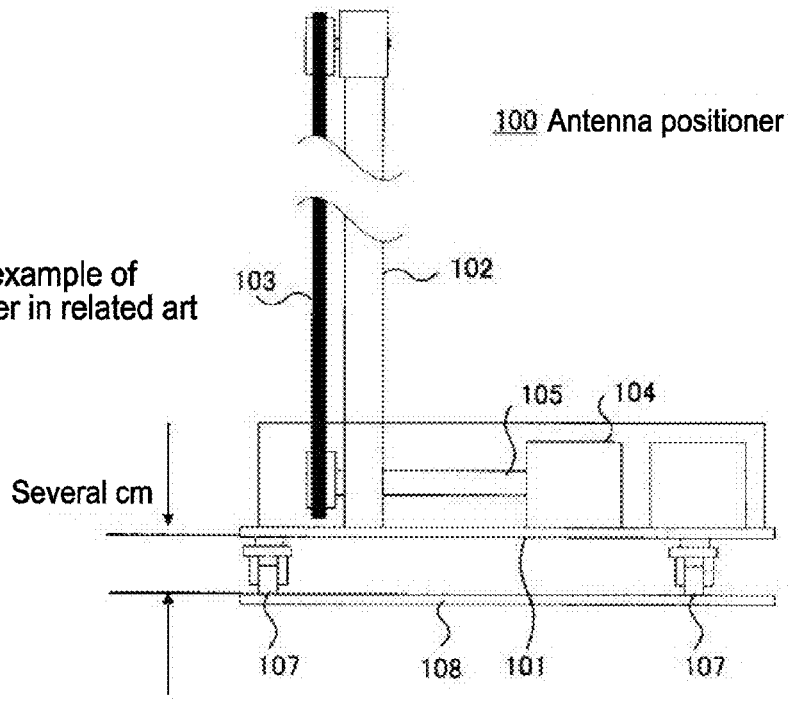
FIGS. 5A and 5B are explanatory diagrams showing internal structure examples of the antenna positioner base portion according to the first embodiment of the present invention and an antenna positioner base portion in related art, when viewed in cross section.

FIG. 5A shows an example in which the antenna positioner 100 in related art is viewed in cross section.

The antenna positioner 100 includes a plate-like antenna positioner base portion 101. The antenna positioner 100 further includes an antenna mast 102 installed in the antenna positioner base portion 101 and a variable-height portion 103 that moves the reception antenna 2 (not shown) vertically along the antenna mast 102. Moreover, the antenna positioner base portion 101 includes a power portion 104 that generates power and a power transmission portion 105 that transmits power generated in the power portion 104 to the variable-height portion 103. A bottom surface of the antenna positioner base portion 101 and a floor 108 are spaced away at a range of about several cm to several tens of cm. In related art, a gap between the bottom surface of the antenna positioner base portion 101 and the floor 108 is wide, and because a capacitance formed therebetween is extremely small, the antenna positioner base portion 101 itself becomes an antenna that radiates EMI. As a result, accuracy of the EMI measurement is prone to be poor.

Figure 5B:
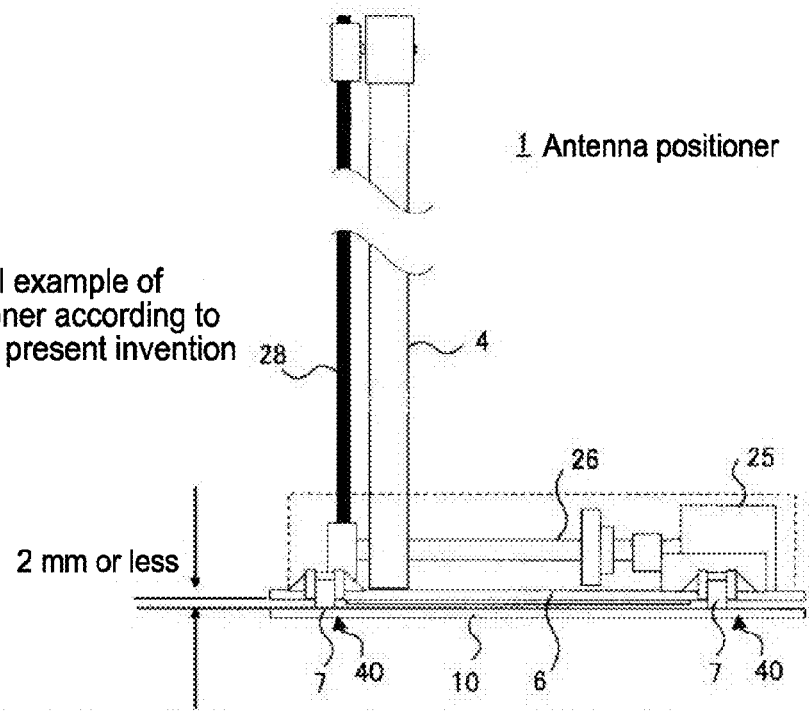

FIG. 5B shows an example in which the antenna positioner base portion 6 described with reference to FIG. 4 is viewed in cross section taken along the line A-A' of FIG. 4.

In the antenna positioner 1, the caster portion 40 is structured as being embedded in the antenna positioner base portion 6. Further, in the caster portion 40, a position of an axle of the wheels 7 is adjusted such that a gap between the bottom surface of the antenna positioner base portion 6 and the floor 10 is set to 2 mm or less. Accordingly, the gap between the bottom surface of the antenna positioner base portion 6 and the floor 10 falls within 2 mm, with the result that, by making a capacitance formed therebetween large, EMI radiation can be suppressed.

Figure 6:
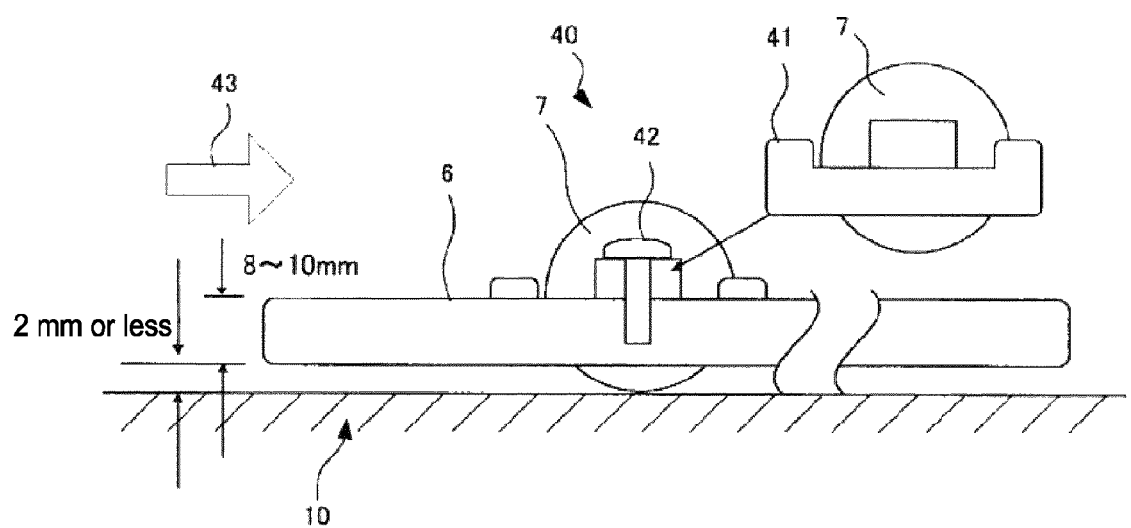
FIG. 6 is an explanatory diagram showing a structure example of a caster portion according to the first embodiment of the present invention.

FIG. 6 shows an example of the caster portion 40 viewed in cross section.

The caster portion 40 includes an axle-fixing portion 41 that fixes an axle 44 of the wheels 7 (see FIG. 7 to be described later). For the purpose of ensuring strength and torsional rigidity, the caster portion 40 and the antenna positioner base portion 6 are joined by the axle-fixing portion 41 having bent portions at end surfaces thereof. The wheels 7 of the caster portion 40 are installed in a state where the wheels 7 are embedded in the antenna positioner base portion 6. The axle-fixing portion 41 that supports the wheels 7 is fixed to the antenna positioner base portion 6 with a metal screw 42. In a case where the flatness of the floor 10 is realized with high accuracy of ±0.5 mm or less, a lower part (back surface) of the antenna positioner base portion 6 is made flat. Then, the gap between the floor 10 and the flat bottom surface opposed to the floor 10 is set to 2 mm or less, thus realizing capacitive coupling with the floor 10.

For the antenna positioner base portion 6 of this example, SUS304 is used. In order to suppress a potential difference at a portion in which the caster portion 40 and the antenna positioner base portion 6 are joined, the metal screw 42, which is the same as that used for the antenna positioner base portion 6, is used.

For example, also in a case where the antenna positioner base portion 6 is formed of a galvanized steel plate or the like, similar to the case of using SUS304, the antenna positioner base portion 6 is provided with slightly-bent portions at the end surfaces thereof, to thereby increase rigidity. The case of using a galvanized steel plate also needs to consider suppression of the potential difference at the portion in which the caster portion 40 and the antenna positioner base portion 6 are joined. It should be noted that the caster portion 40 may be welded to the antenna positioner base portion 6 directly.

Figure 7A:
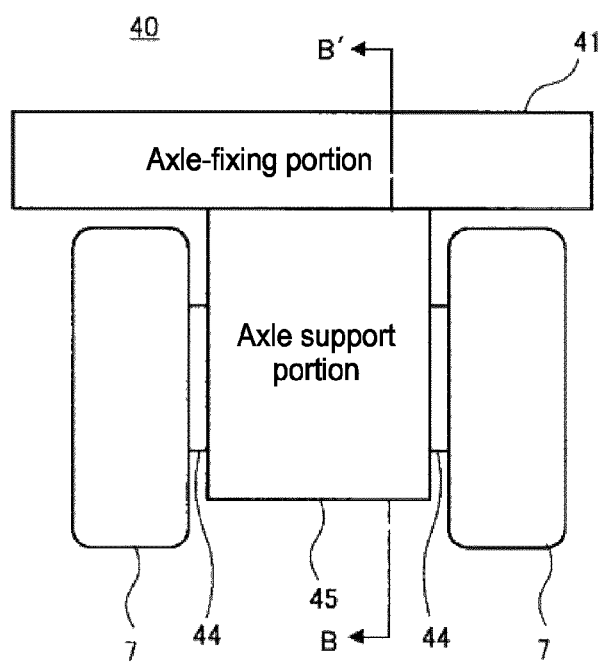
FIGS. 7A and 7B are explanatory diagrams each showing a structure example of a wheel according to the first embodiment of the present invention.
Figure 7B:
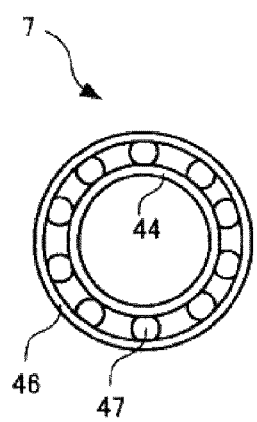

FIGS. 7A and 7B each show a structure example of the wheel 7.

FIG. 7A shows a structure example of the caster portion 40 viewed from the arrow 43 direction of FIG. 6.

The caster portion 40 includes the axle 44 to which the wheels 7 are attached, an axle support portion 45 that supports the axle 44, and the axle-fixing portion 41 that fixes the axle support portion 45. The axle 44 has an outer circumferential surface that is formed with a diameter smaller than an inner circumferential diameter of the wheel 7 and fixed to the center of the wheel 7. The wheel 7 is formed of a material whose conductivity is lower than that of metal, for example, a polyamide-based synthetic fiber (for example, MC Nylon (registered trademark)).

FIG. 7B shows an example of the axle support portion 45 described with reference to FIG. 7A, viewed in cross section taken along the line B-B' of FIG. 7A.

The caster portion 40 includes the axle 44 and a bearing portion 46 coupled to the axle support portion 45. The wheels 7 that move the antenna positioner 1 are structured separate from the antenna positioner base portion 6 in order to achieve improvement of both portability and lowering of the center of gravity. The bearing portion 46 has an inner circumferential surface formed with a diameter larger than an outer circumferential diameter of the axle 44 and supports the axle 44 via bearings 47 made of ceramics inserted between the inner circumferential surface of the bearing portion 46 and the outer circumferential surface of the axle 44.

Between the axle 44 and the bearing portion 46, the plurality of spherical bearings 47 are inserted. The bearings 47 are formed of, for example, ceramics. Owing to the bearings 47, the axle 44 is smoothly rotated with a lower frictional force with respect to the bearing portion 46. Further, even if the height of the wheels 7 exceeds 45 mm so as to enhance a withstand load, electrical interference affecting the reception antenna 2 can be relieved.

Figure 8:
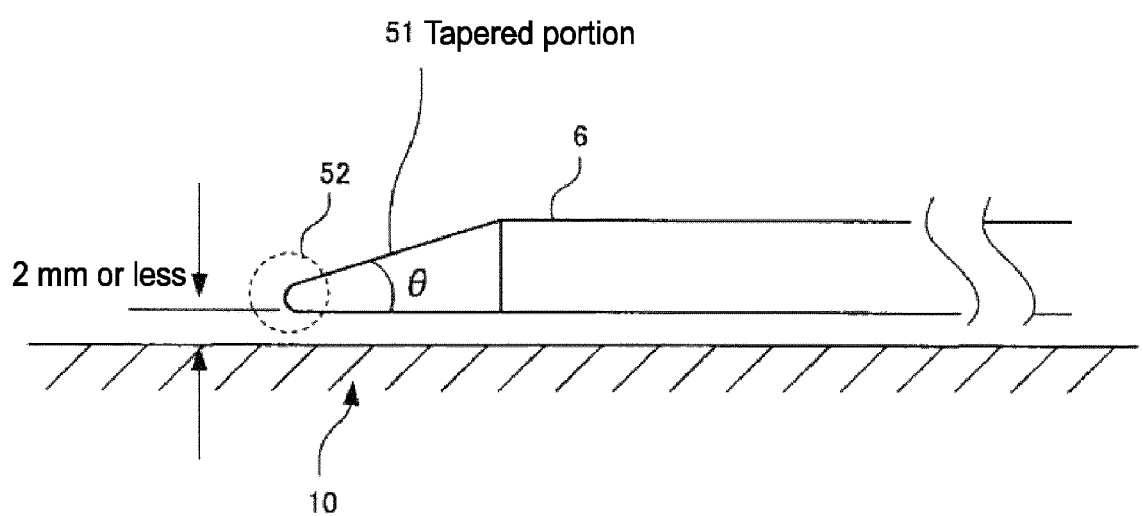
FIG. 8 is an explanatory diagram showing a structure example of an end of the antenna positioner base portion according to the first embodiment of the present invention.

FIG. 8 shows an example of an end of the antenna positioner base portion 6.

Here, a case where the thickness of the antenna positioner base portion 6 is increased will be examined. For example, when the thickness of the antenna positioner base portion 6 exceeds 20 mm, space impedance characteristics are sharply changed at a tip of the antenna positioner base portion 6. Depending on a distance from the reception antenna 2 or a frequency, influences thereof may be observed by the reception antenna 2. In order to avoid such an adverse effect, the end of the antenna positioner base portion 6 is subjected to special processing.

Formed at the end of the antenna positioner base portion 6, which is opposed to the electronic apparatus 12, is a tapered portion 51 having a predetermined tilt angle $\theta$ with respect to the bottom surface of the antenna positioner base portion 6. The tilt angle $\theta$ ranges from 7 to 15 degrees. An end 52 of the tapered portion 51 is subjected to rounding processing to some extent for safety measures. This is because there is a fear that the end 52 as a sharp edge may lower safety on handling. It should be noted that the end 52 may be provided with a protection portion with a low dielectric constant. With such a structure as well, an impedance can be gently caused to change.

(Structure Example of Antenna Mast and Second Mast Support Portion)

Figure 9A:
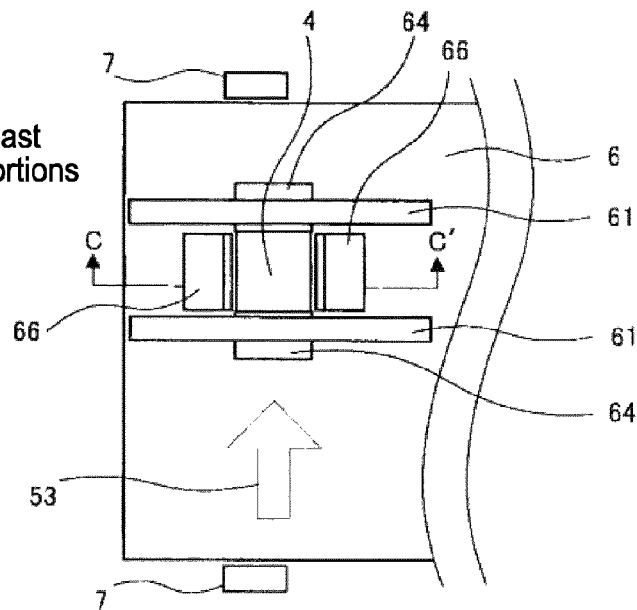
FIGS. 9A and 9B are explanatory diagrams each showing a structure example of an antenna mast according to the first embodiment of the present invention when viewed from above.
Figure 9B:
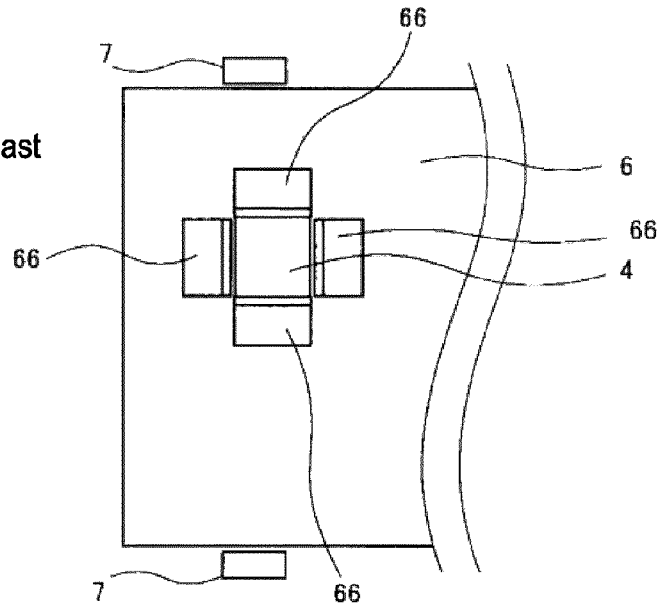

FIGS. 9A and 9B each show a structure example of the antenna mast 4 viewed from above. The antenna mast 4 has a structure in which the antenna mast 4 can withstand swing or an unbalanced load accompanying ascent and descent of the reception antenna 2, in addition to being supported vertically.

FIG. 9A shows a structure example of the antenna mast 4 that is fixed by the second mast support portions 61.

The antenna mast 4 is supported by the two second mast support portions 61. Further, each of the second mast support portions 61 is fixed to the antenna positioner base portion 6 by a third mast support portion 64. Similarly, the antenna mast 4 is fixed to the antenna positioner base portion 6 by two fixing portions 66.

FIG. 9B shows another structure example of the antenna mast 4.

In this example, the antenna mast 4 is fixed by four fixing portions 66.

With any of the structures shown in FIGS. 9A and 9B, the antenna mast 4 is reliably fixed to the antenna positioner base portion 6. Accordingly, even when the heavy reception antenna 2 moves along the antenna mast 4, deflection deformation or vibration of the antenna mast 4 can be suppressed.

(Structure Example of Antenna Positioner and First Mast Support Portion)

Figure 10:
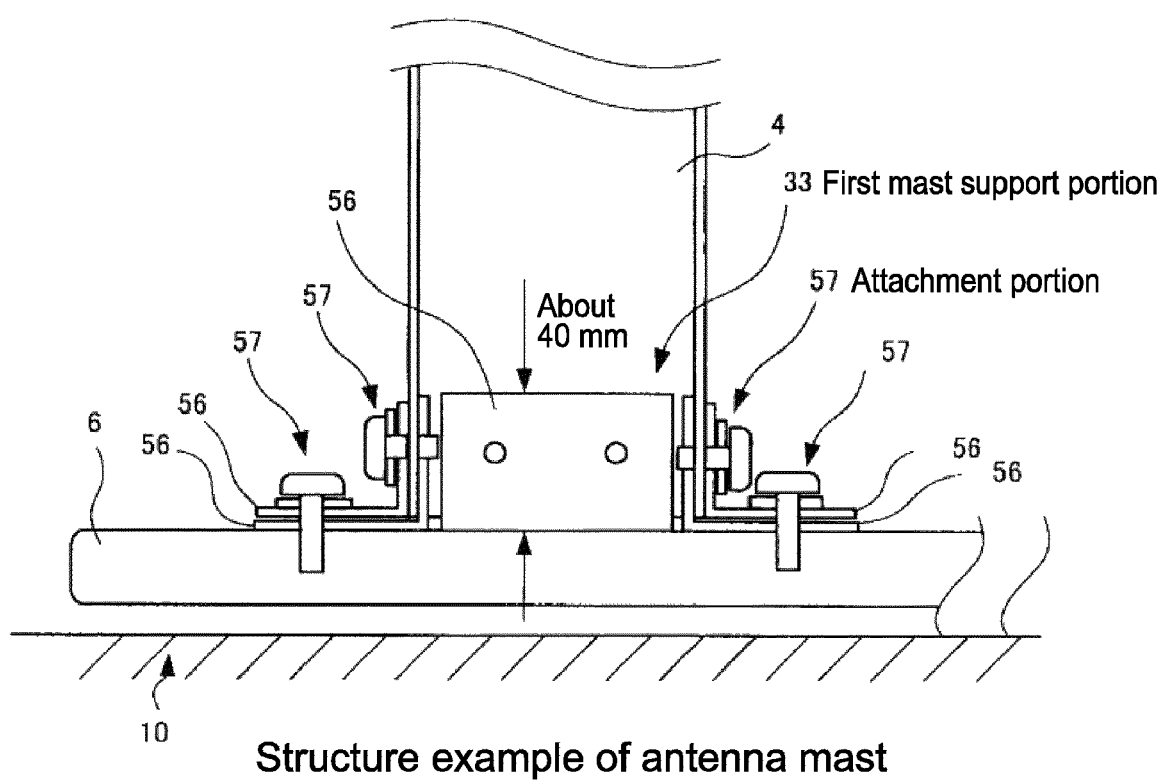
FIG. 10 is an explanatory diagram showing a structure example of the antenna mast according to the first embodiment of the present invention.

FIG. 10 shows an example in which the antenna mast 4 described with reference to FIG. 9A is viewed in cross section taken along the line C-C' of FIG. 9A.

The antenna mast 4 is formed of a reinforcement fiber whose conductivity is lower than that of metal, such as GFRP (Glass Fiber Reinforced Plastics) and FRP (Fiber Reinforced Plastics), and therefore strength thereof is high. Further, the antenna mast 4 is demetallized. The antenna mast 4 is attached with the first mast support portion 33 for supporting the load of the antenna mast 4. The first mast support portion 33 is fixed to the antenna mast 4 and the antenna positioner base portion 6 by attachment portions 57. Each of the attachment portions 57 includes a metal washer and a bolt, for example. Two metal plates 56 are attached to the antenna positioner base portion 6 so as to interpose the antenna mast 4 therebetween. The first mast support portion 33 is made of metal and formed of a galvanized steel plate or the like having a thickness of about 3 to 5 mm. A width of the first mast support portion 33 is adjusted to each size of an inner side and an outer side of the antenna mast 4, and a height thereof is basically set to about 40 mm.

(Demetallization of Antenna Positioner and Second Mast Support Portion)

Figure 11:
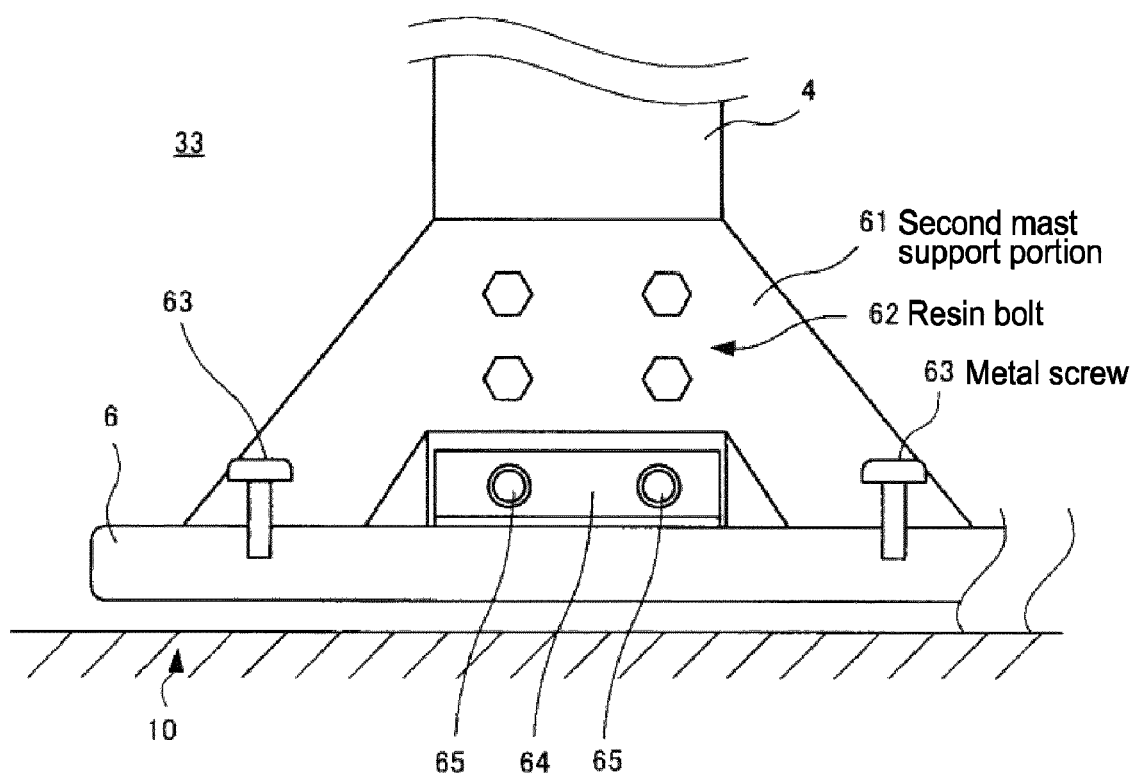
FIG. 11 is an explanatory diagram showing a structure example of the antenna mast according to the first embodiment of the present invention.

FIG. 11 shows an example in which the antenna mast 4 shown in FIG. 10 is viewed from the arrow 53 direction of FIG. 9A.

The antenna mast 4 is supported by the second mast support portions 61 of a substantially-trapezoidal shape. Each of the second mast support portions 61 is formed of, for example, a thermosetting resin, a phenolic resin (for example, Bakelite (registered trademark)), or ceramics. The second mast support portion 61 is formed so that a height thereof from the floor 10 is set to 30 to 40 mm. The second mast support portion 61 is fixed to the antenna mast 4 with resin bolts 62 of lower conductivity. Further, the second mast support portion 61 includes screw holes, and is fixed to the antenna positioner base portion 6 with metal screws 63 (SUS304 etc.) each having a diameter of about 3 to 4 mm.

At a lower portion of the antenna mast 4, the third mast support portion 64 that supports the metal plates 56 described above is installed. The third mast support portion 64 is formed of an ABS (Acrylonitrile butadiene stylene) resin or the like with lower conductivity than that of metal, and is fixed to the antenna mast 4 by attachment portions 65. Each of the attachment portions 65 includes a metal washer and a bolt. With this structure, swing or deflection deformation of the antenna mast 4 can be suppressed and the heavy reception antenna 2 can be fixed to a fixed position when the antenna mast 4 swings. In addition, the height of each of the attachment portions 65 is low and thus does not affect the EMI measurement of the reception antenna 2.

As described above, by interposing the antenna mast 4 between the metal plates 56, the antenna mast 4 is fixed to the antenna positioner base portion 6. Further, the second mast support portions 61 are provided to impart strength against swing or an unbalanced load of the antenna mast 4. As the material of the second mast support portions 61, in view of strength and rigidity, a thermosetting resin (phenolic resin or the like) or ceramics having lower conductivity than that of metal may be used for demetallization. Points to keep in mind are as follows: to make a thickness of the second mast support portions 61 as thinner as possible and to reduce a total quantity of dielectric members having an axis in a direction of the antenna boom 5.

(EMI Suppression From Power Portion, Power Control Portion, and Controller)

As described above, the power portion 25, the power control portion 24, and the controller 23 become EMI generation sources that generate EMI at a time of driving. Since those EMI generation sources are placed closer to the reception antenna 2 than the electronic apparatus 12 that is subjected to a regulatory compliance evaluation, distance attenuation (effect of reducing EMI level due to diffusion according to distance) is minute. Accordingly, a relative difference with respect to EMI radiated from the electronic apparatus 12 becomes small and therefore EMI may be detected in some cases.

In order for the antenna positioner 1 not to detect EMI generated therefrom, it is necessary to take two measures for suppressing minute EMI generated by the power portion 25, the power control portion 24, and the controller 23.

The first measure for suppressing EMI is to arrange a driver case that is brought into close contact with the antenna positioner base portion 6. In this case, a board of the controller 23 and the antenna positioner base portion 6 are electrically connected at multiple points at a height of about 3 to 5 mm. With this structure, the antenna positioner base portion 6 whose impedance is made lower due to electrostatic capacitance of the floor 10 is caused to function as a return path of a non-differential (common) mode current that is generated from the power portion 25, the power control portion 24, and the controller 23.

It should be noted that a multilayer board is used as the printed board onto which the controller 23 is mounted. A high-speed clock to be mounted onto the multilayer board is arranged at a position except an end of the board. High-speed wiring of the multilayer board is arranged with a guard ground. In this case, there are needs for measures against EMI, such as interposing the controller 23 between ground layers, and design for suppressing mode conversion of transmission signals in the board and a connecter portion (not shown).

(Separation of Power Portion, Power Control Portion, and Controller From Reception Antenna)

The second measure for suppressing EMI is to provide a physical distance between the power portion 25, the power control portion 24, and controller 23 and the reception antenna 2. In consideration of a state of practical use of the antenna positioner 1, it is appropriate to arrange the power portion 25, the power control portion 24, and controller 23 away from the reception antenna 2 with a separation distance of at least 1 m therebetween in a facility for examining EMI measures, or with the separation distance of 1.5 to 2 m therebetween in a facility for performing a regulatory compliance evaluation.

In the antenna positioner base portion 6 according to this embodiment, the power portion 25, the power control portion 24, and controller 23 are arranged away from the reception antenna 2 with the separation distance of 1 m or more therebetween. Accordingly, EMI generated and radiated by the power portion 25, the power control portion 24, and controller 23 is suppressed. At this time, there is provided an insulating portion (not shown) on a joint side of the power control portion 24 and the power portion 25. With this structure, there is produced an effect that high frequencies are conducted and radiation of EMI from other portions can be suppressed.

Further, by thinning the antenna positioner base portion 6 and lowering the center of gravity thereof, a radiation efficiency of radio waves that the antenna positioner base portion 6 itself has is drastically reduced. Further, it is also possible to reduce EMI itself while suppressing EMI generated by the power portion 25, the power control portion 24, and controller 23. By a synergistic effect of those described above, suppression of EMI generated from the power portion 25, the power control portion 24, and the controller 23 can be realized. As a result, the cover case 31 made of metal as shown in FIG. 3A can be eliminated. Besides, by eliminating electrical interference of electromagnetic waves of the electronic apparatus 12, which are received by the reception antenna 2, and EMI generated by the power portion 25, an EMI evaluation error can be suppressed.

Incidentally, because the controller 23 has an interface and the like to communicate with the power control portion 24, there is a case where EMI may be radiated from a board as a single body installed in the controller 23. In this case, a connector portion (not shown) of the interface 22 is accommodated within the cover case 31 having a minimum size of an opening necessary for heat radiation of LSIs and the like that are mounted to the power control portion 24. With this structure, EMI radiation from boards of the controller 23 and the power control portion 24 is suppressed. In this case, the height of the cover case 31 is desirably set to about 20 mm.

Figure 12:
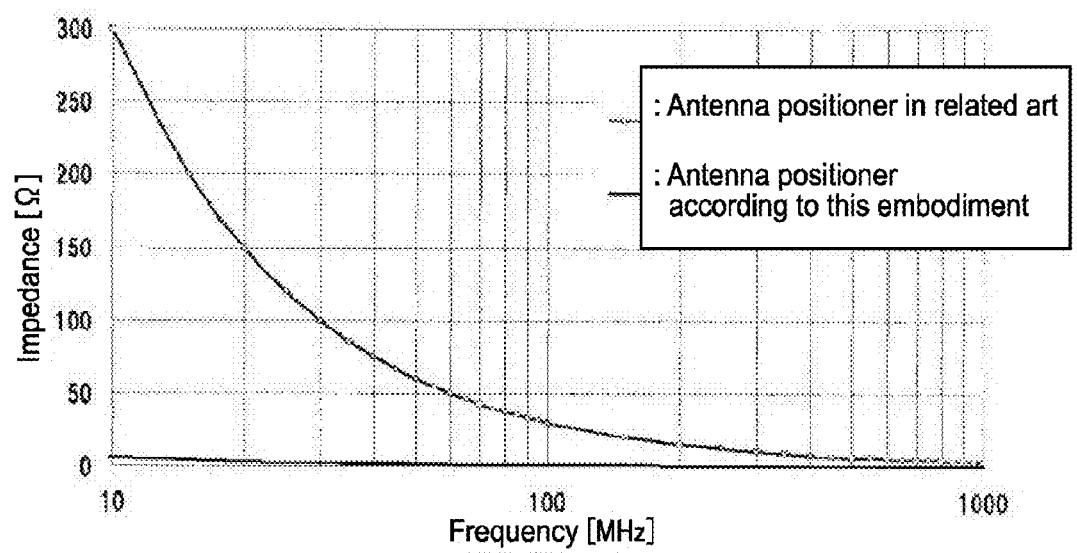
FIG. 12 is an explanatory diagram showing an example of an impedance change with respect to a frequency in the antenna positioner according to the first embodiment of the present invention.

FIG. 12 shows an example of an impedance change with respect to a frequency in an antenna positioner in related art and the antenna positioner 1 according to this embodiment.

This graph shows a case where the abscissa represents a frequency of a current flowing into the electronic apparatus 12 and the ordinate represents an impedance. In this example, an impedance for each frequency in a case where a bottom plate of each antenna positioner base portion has a size of 600 mm×1,000 mm is obtained.

The antenna positioner in related art is placed in a state where the antenna positioner base portion is floating by 100 mm from the floor. Accordingly, as a frequency becomes low, an impedance becomes high. Incidentally, a noise of the power portion 25 such as a motor is generated when a frequency of an applied voltage is about 20 MHz and a noise of the controller 23 such as a CPU is generated when the frequency of the applied voltage is about 30 MHz. Those noises increase the impedance and therefore may possibly become unintended EMI. As a result, when an EMI measurement is performed on the electronic apparatus 12 of a low-frequency band, influence of EMI generated from the antenna positioner base portion itself is significant.

On the other hand, the antenna positioner 1 according to this embodiment is placed in a state where the antenna positioner base portion 6 is away from the floor with a gap of 2 mm or less therebetween. Accordingly, irrespective of the magnitude of a frequency, the impedance is extremely low. In addition, an increase of the impedance due to the influence of the noises of the controller 23 and the power portion 25 is suppressed. Consequently, EMI generated from the antenna positioner base portion 6 becomes negligible and does not become a factor of an EMI evaluation error.

Figure 13:
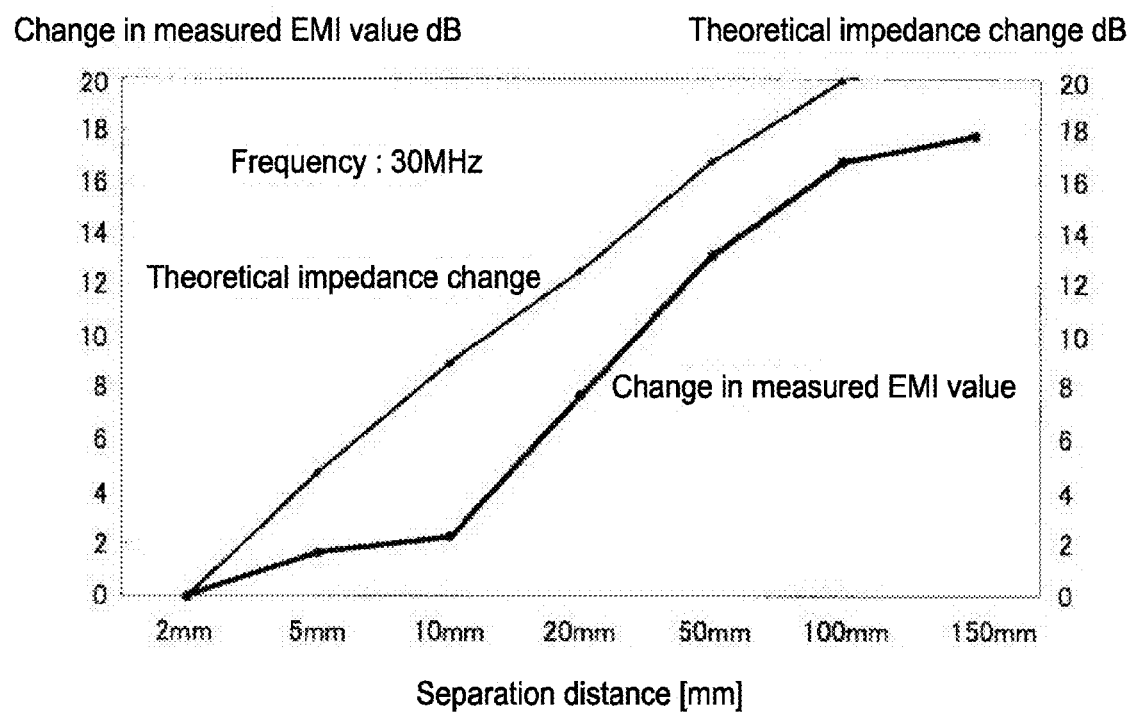
FIG. 13 is an explanatory diagram showing an example of a theoretical impedance change and a change in measured EMI value with respect to a separation distance between a floor and the antenna positioner base portion according to the first embodiment of the present invention.

FIG. 13 shows an example of a theoretical impedance change and a change in measured EMI value when a current of a constant frequency (for example, 30 MHz) flows in the electronic apparatus 12 in a case where the bottom surface of the antenna positioner base portion 6 is placed away from the floor 10. This graph shows a case where the abscissa represents a separation distance of the bottom surface of the antenna positioner base portion 6 from the floor 10 and the ordinate represents an impedance change.

The theoretical impedance change is changed in a substantially straight line when the separation distance is changed from 2 mm to 100 mm. On the other hand, the change in measured EMI value follows the theoretical impedance change to some extent, but a change amount thereof becomes smallest when the separation distance is 2 mm. Accordingly, the separation distance of the bottom surface of the antenna positioner base portion 6 from the floor 10 is desirably set to 2 mm or less.

FIGS. 14A to 14D each show an example of an impedance difference of the reception antenna 2 placed at a height of 1 m from the floor 10.

In this experiment, first, the impedance of the reception antenna 2 with respect to the floor 10 is measured in a state where all the devices are removed. The impedance is set as the reference impedance. The impedance is measured using a network analyzer (not shown) that transmits a signal of a predetermined frequency. Then, the antenna positioner base portion 6 is placed on the floor 10 under various conditions (first case to third case) to measure relative differences between each of respective impedances and the reference impedance. Also in this example, the antenna positioner base portion 6 whose bottom surface has the size of 600 mm×1,000 mm is used.

Figure 14A:
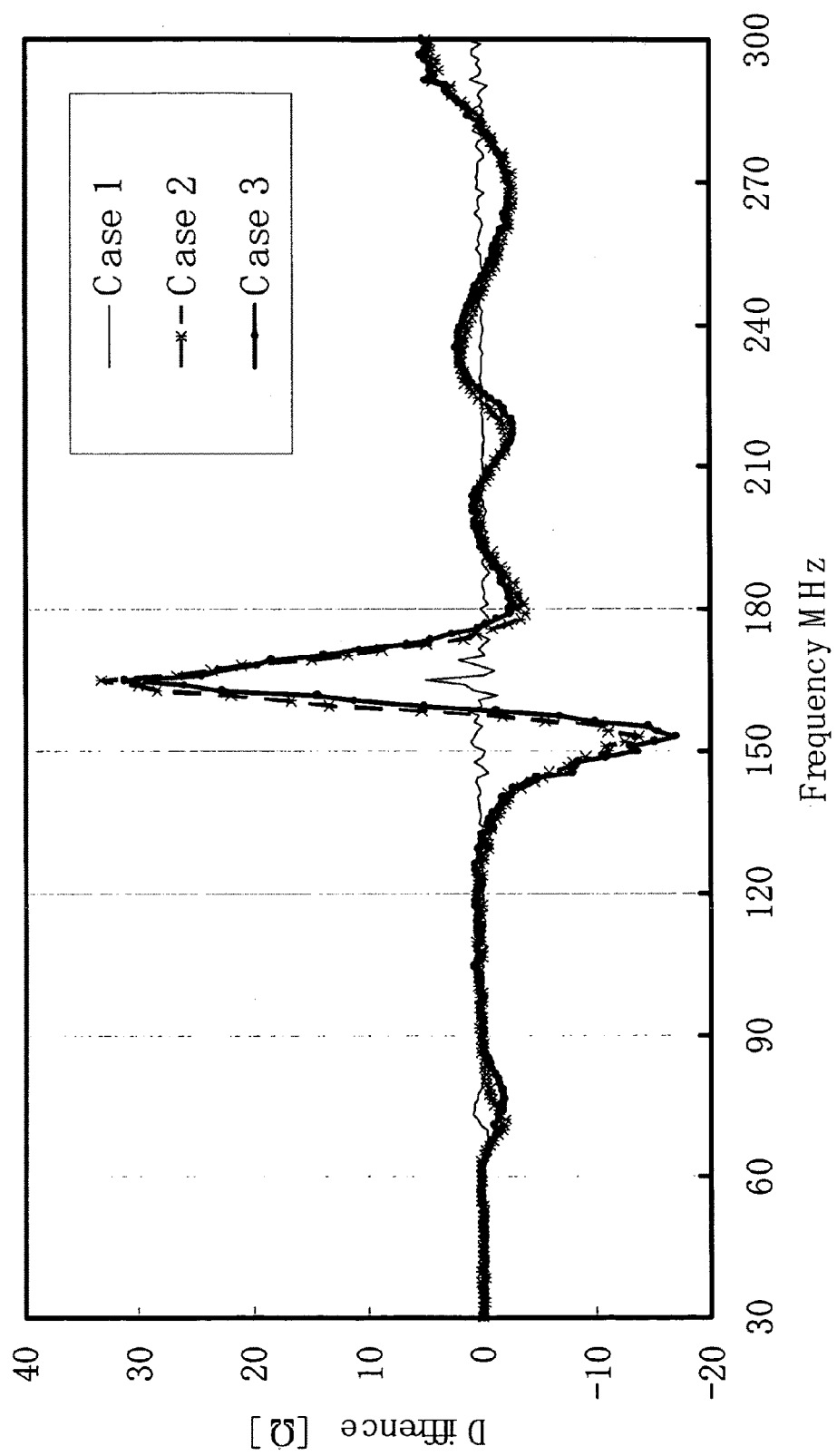
FIGS. 14A to 14D are explanatory diagrams each showing an example of a difference with respect to a reference impedance according to the first embodiment of the present invention.

FIG. 14A is an example showing impedance differences between each of the first case to the third case and the reference impedance.

In FIG. 14A, graphs of impedance differences of the first case to the third case with respect to the reference impedance, those graphs being described later, are superimposed. Hereinafter, the graphs for each case will be described.

Figure 14B:
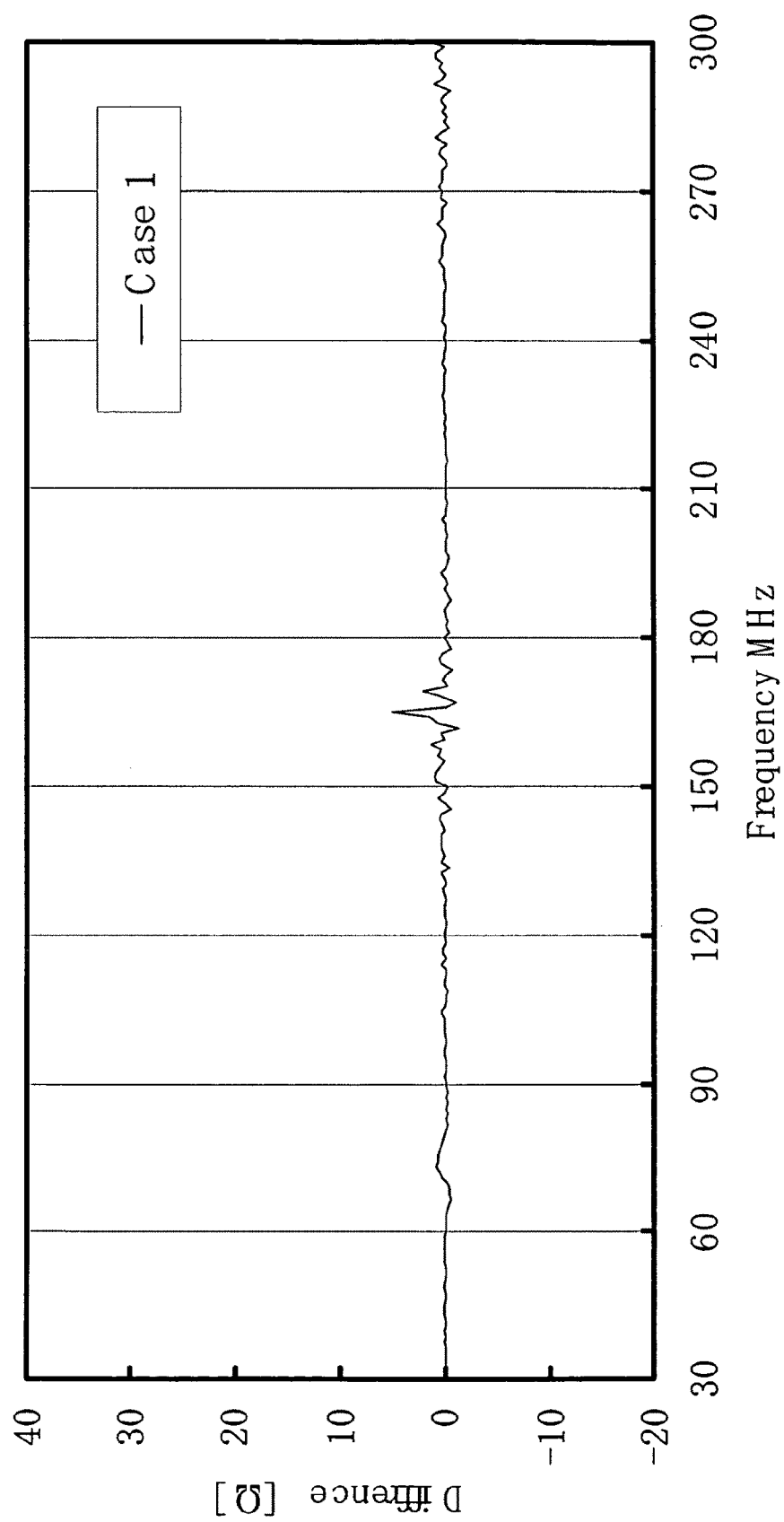

FIG. 14B is an example showing an impedance difference between the first case and the reference impedance.

In this case, the separation distance of the bottom surface of the antenna positioner base portion 6 from the floor 10 is set to 2 mm. In this case, there occurs almost no difference with respect to a frequency change.

Figure 14C:
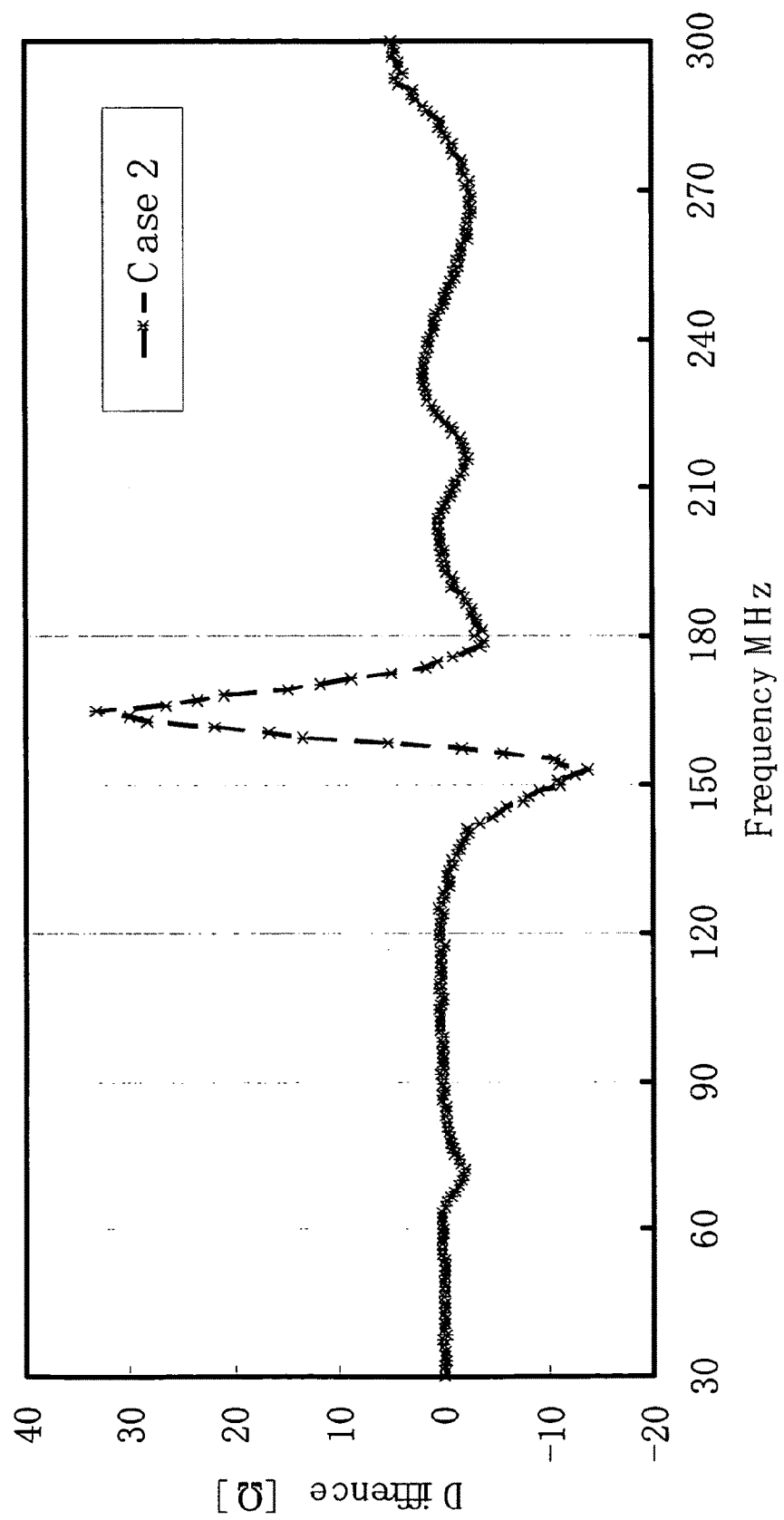

FIG. 14C is an example showing an impedance difference between the second case and the reference impedance.

In this case, the separation distance of the bottom surface of the antenna positioner base portion 6 from the floor 10 is set to 10 cm. Further, the thickness of the antenna positioner base portion 6 is also set to 10 cm. The antenna positioner base portion 6 is formed of a metal chassis. In this case, a large difference occurs at a frequency ranging about 140 to 180 MHz.

Figure 14D:
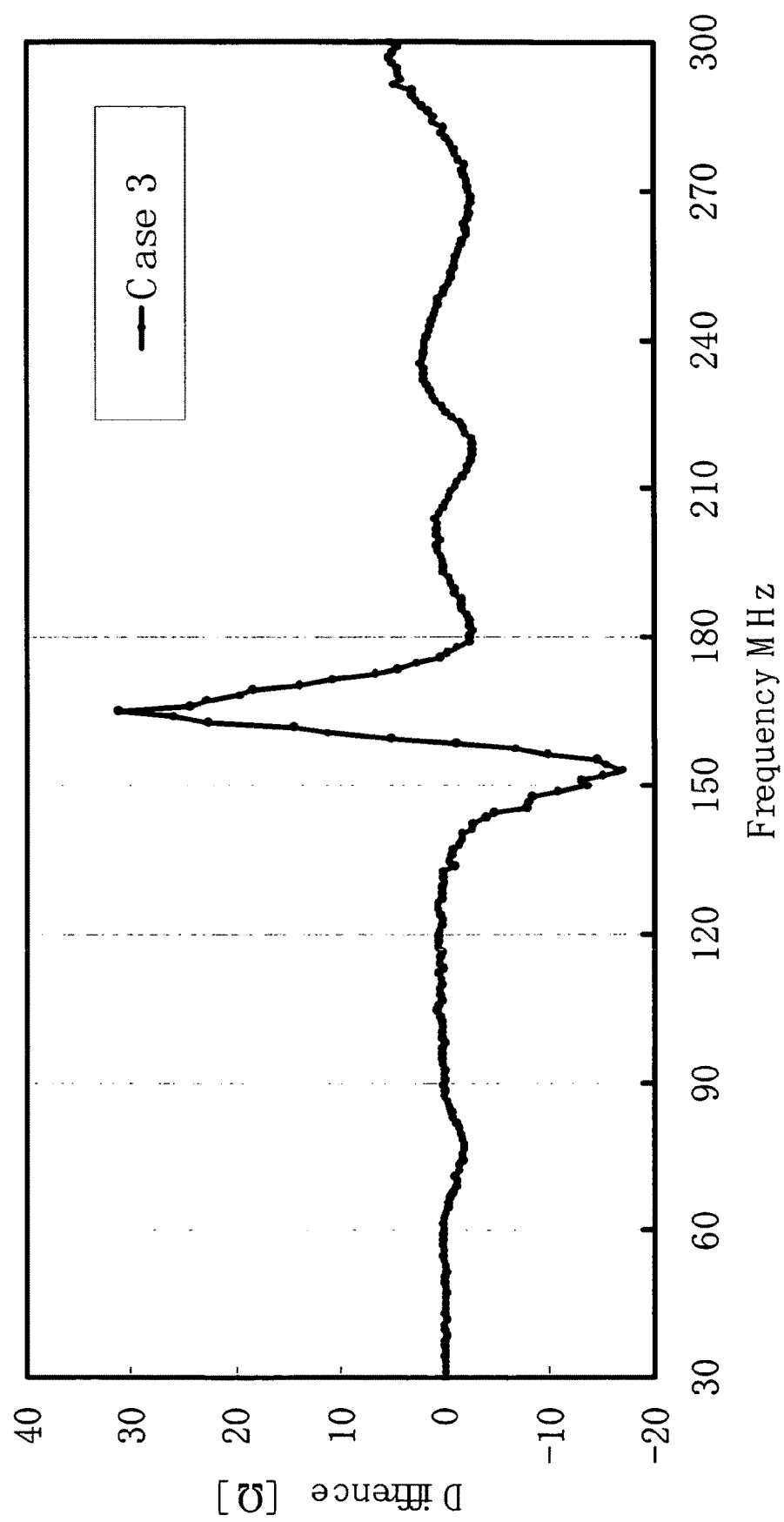

FIG. 14D is an example showing an impedance difference between the third case and the reference impedance.

In this case, the separation distance of the bottom surface of the antenna positioner base portion 6 from the floor 10 is set to 10 cm. Further, the thickness of the antenna positioner base portion 6 is also set to 10 cm. The antenna positioner base portion 6 is formed of a metal chassis. In addition, a metal chassis having a thickness of 20 cm is placed on the antenna positioner base portion 6. In this case, a large difference occurs at a frequency ranging about 140 to 180 MHz.

As described above, when the height of the antenna positioner base portion 6 with respect to the floor 10 becomes high or a metal body is present on the antenna positioner base portion 6, the characteristics of the reception antenna 2 are changed and errors are prone to occur. In order not to cause a difference with respect to the reference impedance, it is effective that the separation distance of the bottom surface of the antenna positioner base portion 6 from the floor 10 is set to 2 mm and the thickness of the antenna positioner base portion 6 is made as thinner as possible, as shown in the first case. That is, it is found that, by thinning the antenna positioner base portion 6 and lowering the center of gravity thereof, the difference with respect to the reference impedance is not caused to occur.

FIGS. 15A to 15H each show an example of an EMI level in a case where the height of the antenna positioner base portion 6 in which the controller 23, the power control portion 24, and the power portion 25 that become generation sources of EMI are installed is changed vertically with respect to the floor 10.

FIG. 15A shows an example of EMI levels in a case where the separation distance of the antenna positioner base portion 6 from the floor 10 is changed to a range of 2 to 150 mm.

In FIG. 15A, graphs of EMI levels in the case where the separation distance is set to 2 to 150 mm are superimposed. Hereinafter, the graphs for each separation distance will be described.

FIG. 15B shows an example of an EMI level in a case where the separation distance is set to 2 mm. In this case, it can be said that, though a level G drops about 10 dB at a frequency of around 60 MHz, the level is flat in any frequency band (30 to 300 MHz).

FIG. 15C shows an example of an EMI level in a case where the separation distance is set to 5 mm.

FIG. 15D shows an example of an EMI level in a case where the separation distance is set to 10 mm.

FIG. 15E shows an example of an EMI level in a case where the separation distance is set to 20 mm.

In FIGS. 15C to 15E, it is shown that the EMI levels are gradually increased at a frequency of around 150 MHz.

FIG. 15F shows an example of an EMI level in a case where the separation distance is set to 50 mm.

FIG. 15G shows an example of an EMI level in a case where the separation distance is set to 100 mm.

FIG. 15H shows an example of an EMI level in a case where the separation distance is set to 150 mm.

In FIGS. 15F to 15H, it is shown that the EMI levels are gradually increased not only at a frequency of around 150 MHz but also at frequencies of around 30 MHz, 90 MHz, 240 MHz, and 300 MHz.

As described above, when the height of the controller 23 and the like that become generation sources of EMI becomes high with respect to the floor 10, because the EML level rises, the controller 23 and the like need to be housed in a case that shields EMI. On the other hand, in the case where the separation distance is set to 2 mm or less, fluctuations of the level are smallest and thus influence of EMI can be suppressed. In this case, it is shown that the reception antenna 2 is not affected even when the controller 23 and the like are not housed in a case.

According to the first embodiment described above, by suppressing electromagnetic waves generated by the antenna positioner 1, it is possible to suitably measure electromagnetic waves of the electronic apparatus 12 as a measurement target. Accordingly, there are produced effects as follows. Generation of unintended EMI resulting from the antenna positioner 1 can be suppressed, attentions can be focused on an EMI-measure design that should be done in product design fields, and regulatory compliance guarantee can be reliably realized.

Further, while the antenna positioner 1 according to this embodiment has the same width and length of the antenna positioner base portion 6 under each condition, the impedance calculated by setting the separation distance from the floor 10 to 2 mm becomes about 2Ω at 30 MHz. Further, as the frequency becomes high, the impedance becomes lower. Accordingly, even in a frequency band of EMI generated from the power portion 25, the power control portion 24, and the controller 23, it is possible to achieve a state in which electrical connection to the floor 10 is excellent. Moreover, because the antenna positioner base portion 6 forms an excellent return path with respect to an EMI current, a state in which the antenna positioner base portion 6 hardly acts as a radiation antenna can be realized. Further, by lowering the center of gravity of the antenna positioner base portion 6, swing or minute vibration that occurs in a case where the height of the reception antenna 2 is changed can be suppressed. As a result, there is produced an effect that a mechanical damage to the reception antenna 2 can be prevented from a long-term viewpoint.

Further, the mast-fixing portion is formed to have the height of 45 mm or less vertically to the floor and is considered to be the same as the floor. Accordingly, there is produced an effect that an EMI measurement of an electronic apparatus is not affected by the mast-fixing portion. Moreover, the height of the mast-fixing portion, which is set to 45 mm or less, is compliant with the documents issued by CISPR (CISPR 16-1-4).

By taking a sufficient distance with respect to the reception antenna 2 and lowering the center of gravity of the antenna positioner base portion 6, it is also possible to eliminate the cover case 31 for shielding EMI generated from the power portion 25, the power control portion 24, and the controller 23. It should be noted that a nonmetal cover case 31 made of, for example, an ABS resin, may be provided so as to cover the circumference of the antenna positioner base portion 6.

Further, electrical interference of an element particularly in a vertically-polarized wave and the second mast support portions 61 in the vicinity of 1 m as the height of the reception antenna 2 can be suppressed. Accordingly, there is produced an effect that it is possible to suppress an EMI evaluation error of a frequency at which a maximum EMI radiation from the electronic apparatus 12 whose electromagnetic waves are measured at the height of about 1 m is obtained (on theoretical calculation of height pattern, for example, 400 MHz or less in 10-meter radiated emission measurements).

Further, in a state where the electronic apparatus 12 and peripheral apparatuses connected thereto are in combination with one another (test system for EMI evaluation), a measurement distance is defined. It is possible to achieve a state where the base portion of the antenna positioner 1 and the floor 10 are excellently electrically connected to each other without providing asperities on the floor 10 between the reception antenna 2 and the electronic apparatus 12, and support various sizes of test systems for EMI evaluation. Further, by making a smooth surface so that asperities are not formed on the floor 10, it is also possible to suppress diffusion of reflected waves of radio waves due to the floor 10. Accordingly, deterioration of radio-wave propagation characteristics such as NSA can be avoided.

Further, by forming the antenna mast 4 and the second mast support portions 61 of a material having lower conductivity than metal for demetallization, there is produced an effect that the EMI measurement is not adversely affected.

Further, by reducing the height of the wheel 7, the gap between the floor 10 and the bottom surface of the antenna positioner base portion 6 is made small as much as possible and the gap is kept with a constant distance. With this structure, the impedance of the antenna positioner base portion 6 becomes about 1 to 2Ω, and accordingly an electromagnetic wave of a unique resonant frequency is not generated between the floor 10 and the antenna positioner base portion 6, resulting in an effect that the EMI measurement of the reception antenna 2 is not adversely affected.

Further, the tapered portion 51 is formed at the end of the antenna positioner base portion 6 and is subjected to rounding processing. With this structure, a sharp change in impedance at the end of the antenna positioner base portion 6 can be suppressed.

Further, the antenna positioner base portion 6 includes the caster portion 40 that moves the antenna positioner base portion 6 horizontally with respect to the floor 10. With this structure, the heavy antenna positioner 1 can be easily moved to a desired position.

(2. Second Embodiment)

(Thinning of Antenna Positioner Base Portion and Lowering of Center of Gravity Thereof)

Next, a second embodiment of the present invention will be described with reference to FIG. 16. In the following description, portions corresponding to the figures that has been described in first embodiment are denoted by the same reference numerals and detailed descriptions thereof will be omitted.

In this embodiment, there is examined a case where, when the flatness of the floor 10 near the position where the antenna positioner 1 is placed is insufficient, the separation distance therebetween is above 2 mm (for example, 5 mm). In this case, in accordance with a frequency band of EMI generated in the controller 23 and the power portion 25 such as a servo motor, a dielectric material having a largest dielectric constant in the frequency band is placed on a lower portion of the bottom surface of the antenna positioner base portion 6. At this time, a thickness of the placed dielectric material and its placing range does not come into contact with protrusions of the floor 10. Accordingly, the impedance of the antenna positioner base portion 6 can be made smaller. Further, it is possible to bring out an effect of reducing the radiation efficiency of the antenna positioner base portion 6 as an antenna and an effect of functioning as a return path of the power portion 25, its driver, and the controller 23.

Figure 16:
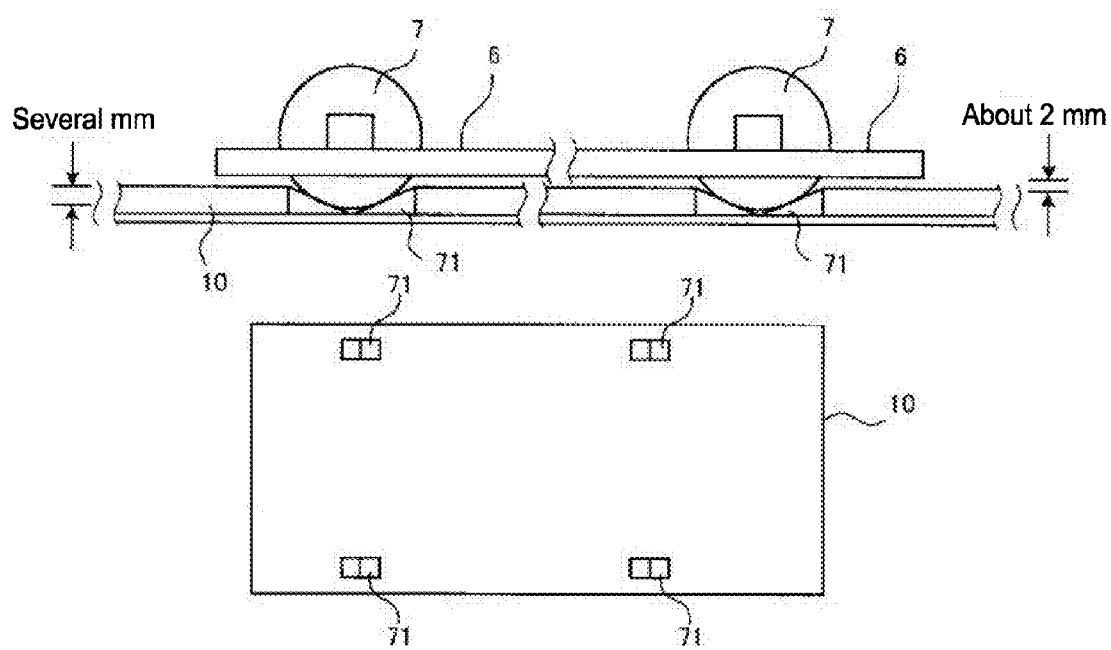
FIG. 16 is an explanatory diagram showing a structure example of a floor according to a second embodiment of the present invention.

FIG. 16 shows an example of the antenna positioner base portion 6 and the floor 10 in side view. Though the antenna positioner base portion 6 is made thinner and its center of gravity is made lower as much as possible in the first embodiment described above, further thinning and lowering can be made by focusing on the wheel 7 and the floor 10.

In a case where the position at which the antenna positioner 1 is placed is fixed, reception portions 71 each having a dent whose depth is about several mm are formed at predetermined positions of the floor 10. The length of the antenna mast 4 exceeds 4 m in general. Therefore, the depth of each of the reception portions 71 should fall within a range of several mm in terms of convenience and safety. At the time of the EMI measurement, the wheels 7 are fit into the reception portions 71 and the antenna positioner base portion 6 is stopped at a predetermined position to be fixed. Further, the separation distance between the bottom plate of the antenna positioner base portion 6 and the floor 10 can be kept within 2 mm.

By forming the floor 10 as described above, it is possible to thin the antenna positioner base portion 6 and lower the center of gravity thereof, the antenna positioner base portion 6 supporting the reception antenna 2 and the antenna mast 4. With this structure, there are produced effects of enhancing capacitive coupling together with the metal floor 10 of the EMI evaluation facility and suppressing electrical interference to the reception antenna 2 at a high frequency of 30 MHz or more. Simultaneously, there are produced effects of suppressing swing and vibration caused in the case where the height of the reception antenna 2 is changed and preventing a mechanical damage to the reception antenna 2.

It should be noted that after the antenna positioner base portion 6 thus structured is stopped at the predetermined position on the floor 10, only the wheels 7 may be removed. In this case, an insulating portion that insulates a current is formed in a thickness of several mm on the bottom surface of the antenna positioner base portion 6. Then, in a case where the antenna positioner base portion 6 is moved to a predetermined position on the floor 10, the wheels 7 are removed and the antenna positioner base portion 6 is stopped due to contact between the insulating portion and the floor 10. With this structure, a contact area of the antenna positioner base portion 6 and the floor 10 is increased and a stationary friction force becomes strong, with the result that the position of the antenna positioner 1 can be reliably fixed.

(3. Third Embodiment)

(EMI Suppression From Power Portion, Power Control Portion, and Controller)

Next, a third embodiment of the present invention will be described with reference to FIGS. 17 and 18. In the following description, portions corresponding to the figures that has been described in first embodiment are denoted by the same reference numerals and detailed descriptions thereof will be omitted.

Figure 17:
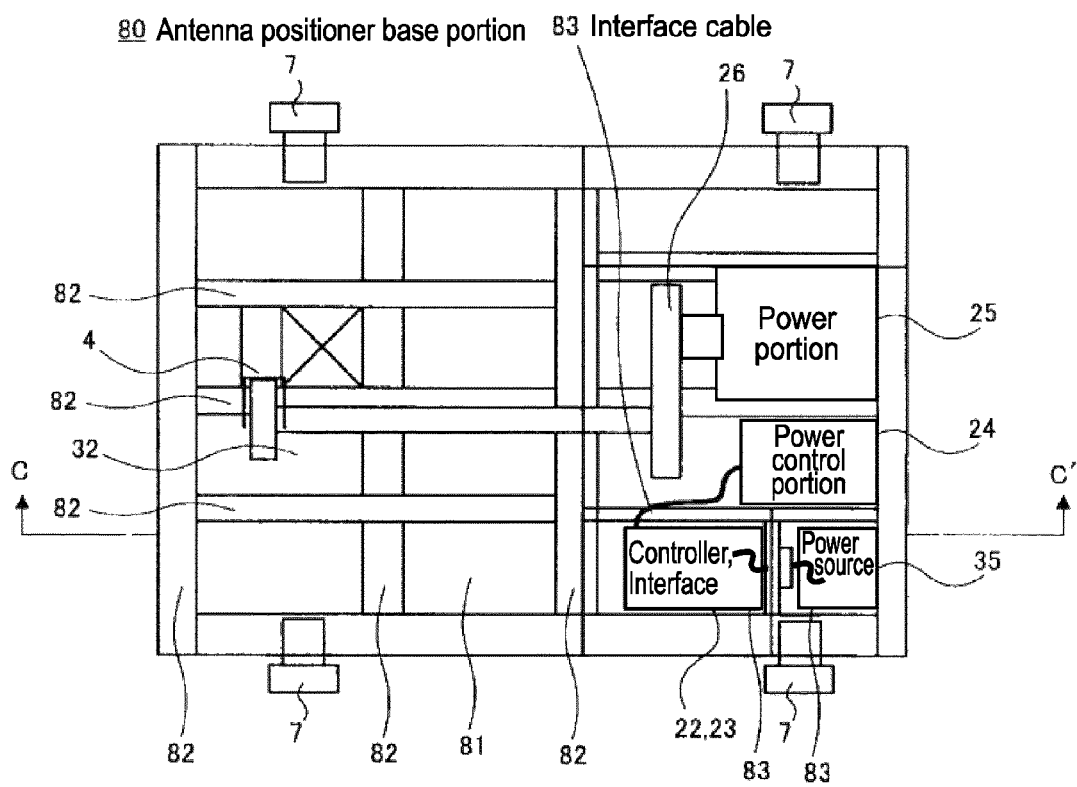
FIG. 17 is an explanatory diagram showing a structure example of an antenna positioner base portion according to a third embodiment of the present invention when viewed from above.

FIG. 17 shows an external structure example of an antenna positioner base portion 80 when viewed from above.

A basic structure of the antenna positioner base portion 80 is similar to that of the antenna positioner base portion 6 described in the first embodiment above. The antenna positioner base portion 80 in this embodiment includes a frame 82 that reinforces a bottom surface steel plate 81 whose thickness is thin. By the frame 82, the strength of the antenna positioner base portion 80 is maintained and distortion deformation can be prevented. Further, the interface 22, the controller 23, and the power control portion 24 are connected by interface cables 83. Similarly, the interface 22, the controller 23, and the power source 35 are connected by the interface cables 83. The interface cables 83 are wired so as to be in close contact with the bottom surface steel plate 81 while utilizing spaces between the structural members. With this structure, EMI radiation from the interface cables 83 can be suppressed.

Figure 18:
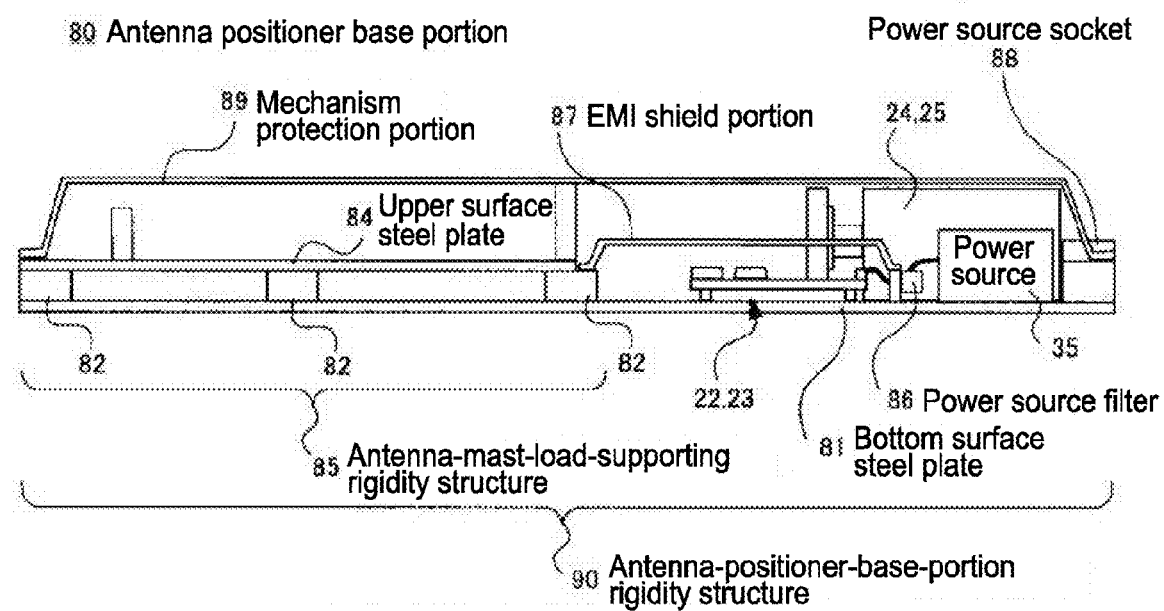
FIG. 18 is an explanatory diagram showing a structure example of the antenna positioner base portion according to the third embodiment of the present invention when viewed in cross section.
Figure 19A:
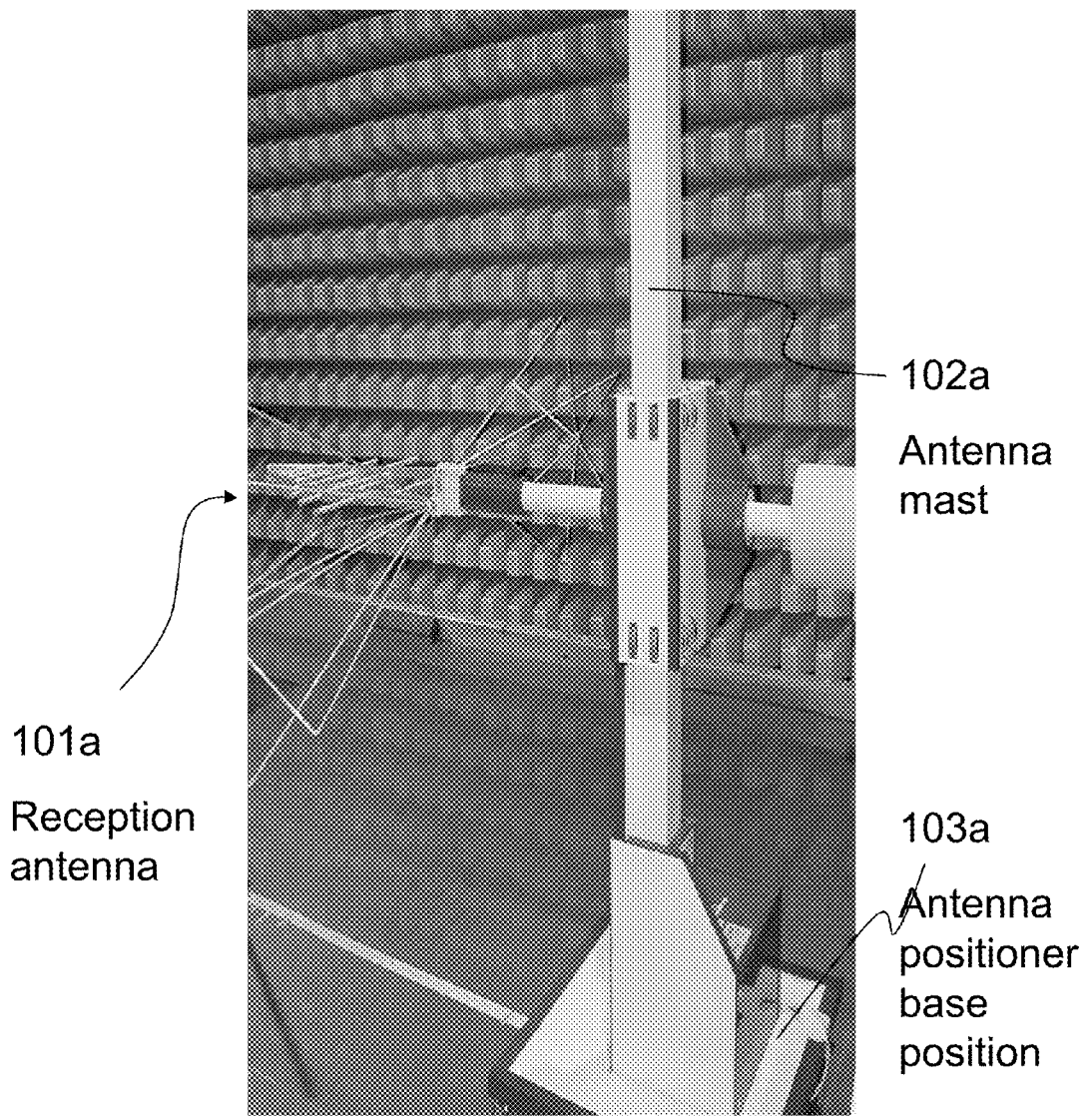
FIGS. 19A to 19C are explanatory diagrams each showing a structure example of an antenna positioner in related art.
Figure 19B:
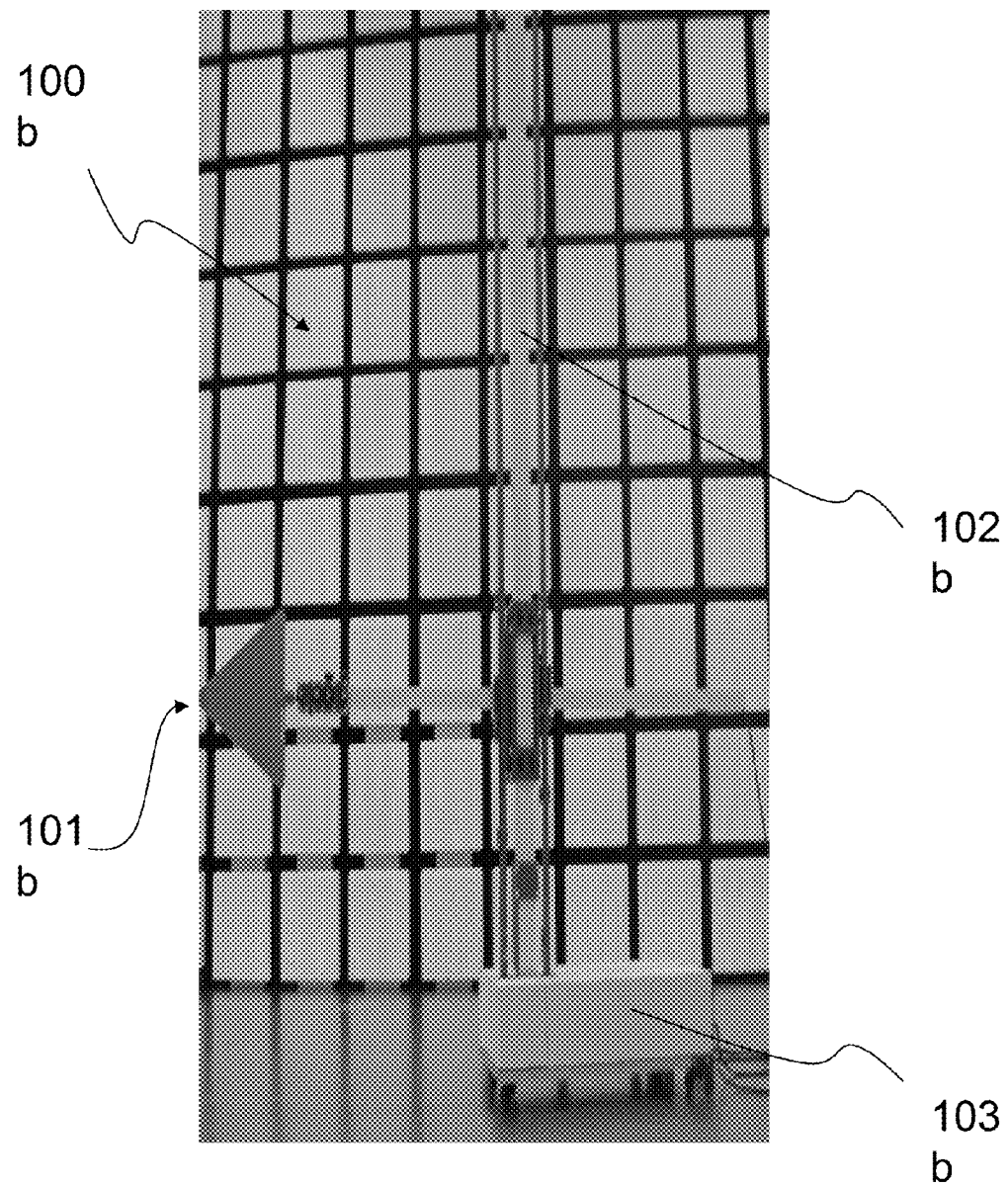
Figure 19C:
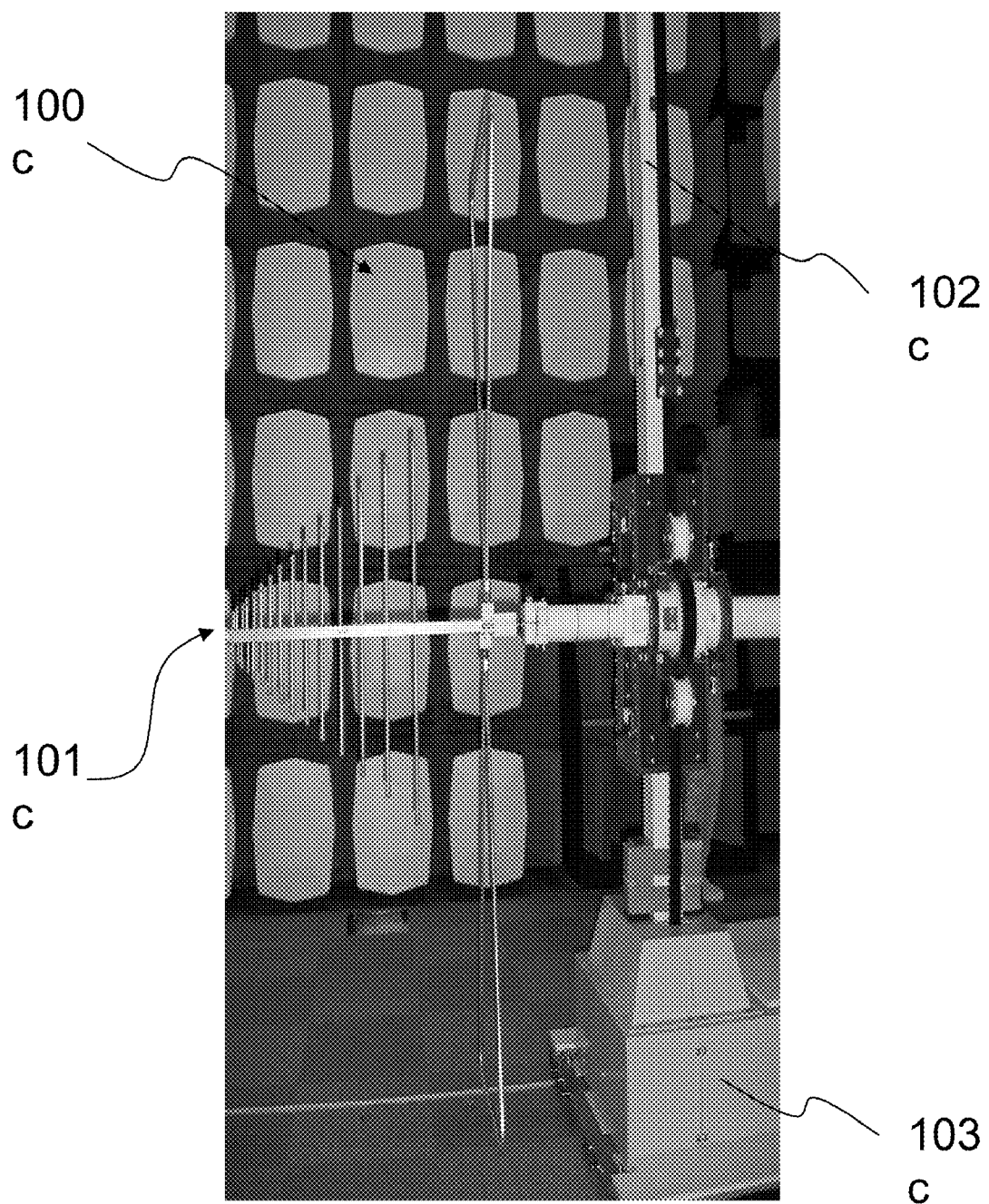

FIG. 18 shows an example in which the antenna positioner base portion 80 described with reference to FIG. 17 is viewed in cross section taken along the line C-C' of FIG. 17.

The antenna positioner base portion 80 of this embodiment includes the frame 82 that reinforces the bottom surface steel plate 81 and an upper surface steel plate 84 that covers the frame 82. The frame 82 and the upper surface steel plate 84 constitute an antenna-mast-load-supporting rigidity structure 85 that supports the load of the antenna mast 4. Further, the antenna positioner base portion 80 includes an EMI shield portion 87 that shields EMI generated from the interface 22 and the controller 23. The interface 22, the controller 23, and the power source 35 are connected by a power source filter 86. The EMI shield portion 87 is a member formed of a sheet metal or the like.

Moreover, the antenna positioner base portion 80 includes a mechanism protection portion 89 that covers upper surfaces of the upper surface steel plate 84, the EMI shield portion 87, the power control portion 24, and the power portion 25. The mechanism protection portion 89 is a member formed of, for example, an ABS resin or FRP (Fiber Reinforced Plastics) and relieves an impact from outside applied to the power control portion 24, the power portion 25, and the like. The bottom surface steel plate 81, the frame 82, the upper surface steel plate 84, the EMI shield portion 87, and the mechanism protection portion 89 constitute an antenna-positioner-base-portion rigidity structure 90 that enhances rigidity of the antenna positioner base portion 80. Further, the antenna positioner base portion 80 includes a power source socket 88 connected to the power source 35. A part of the power source socket 88 is exposed to the outside of the mechanism protection portion 89.

As described above, the rigidity of the antenna positioner base portion 80 is increased by the antenna-mast-load-supporting rigidity structure 85 and the antenna-positioner-base-portion rigidity structure 90. Further, the power portion 25, the power control portion 24, and the controller 23 are spaced away from the reception antenna 2 and brought into close contact with the antenna positioner base portion 80, with the result that electrically excellent coupling state is attained. Accordingly, the antenna positioner base portion 80 whose impedance is lowered by electrostatic capacitance of the floor 10 can be utilized as a return path of EMI generated from the respective structural members. In addition, there is produced an effect that an EMI radiation efficiency that the antenna positioner base portion 80 itself has is drastically reduced.

(4. Modified Example)

(Demetallization of Antenna Mast Support Portion)

Further, the first mast support portion 33 may be demetallized while maintaining necessary strength by performing NC (Numerical Control Machining) processing on a base material made of ceramics. For example, a ceramic column having a length of about 15 cm is produced and a lower portion of the antenna mast 4 is inserted into the ceramic column. By demetallizing the antenna mast 4 and the first mast support portion 33, the conductivity is reduced, with the result that there is an effect that electrical interference to the reception antenna 2 can be suppressed. Moreover, the metal plates 56 attached to the first mast support portion 33 become unnecessary, with the result that there is an effect that the number of components that constitute the antenna positioner 1 is reduced and the production is made easy.

The present application contains subject matter related to that disclosed in Japanese Priority Patent Application JP 2008-289269 filed in the Japan Patent Office on Nov. 11, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An electromagnetic wave measuring apparatus, comprising:
   a reception antenna to receive an electromagnetic wave generated from an electronic apparatus placed at a predetermined distance away;
   an antenna mast to hold the reception antenna; and
   a base portion to fix an end of the antenna mast in a vertical direction with respect to a floor on which the electromagnetic wave measuring apparatus is placed, the base portion having a flat bottom surface opposed to the floor, the bottom surface and the floor forming a gap of 2 mm or less therebetween and being capacitively coupled to each other,
   wherein the base portion includes
      a mast-fixing portion that has a height of 45 mm or less in the vertical direction with respect to the floor and fixes the end of the antenna mast,
      a power portion that is disposed at a position away from the reception antenna and generates power, and
      a power transmission portion that transmits the power generated by the power portion to the reception antenna and vertically moves the reception antenna along the antenna mast.

2. The electromagnetic wave measuring apparatus according to claim 1,
   wherein the base portion includes
      a power control portion that is disposed at a position away from the reception antenna and controls a drive of the power portion,
      a controller that is disposed at a position away from the reception antenna and instructs the power control portion to operate, and
      a shield portion that covers a circumference of the base portion and shields electromagnetic waves generated from the power portion, the power control portion, and the controller.

3. The electromagnetic wave measuring apparatus according to claim 2,
   wherein the base portion includes a caster portion that horizontally moves the base portion with respect to the floor,
   wherein the caster portion includes
      wheels formed of a material having conductivity lower than conductivity of metal,
      an axle that has an outer circumferential surface that is formed with a diameter smaller than an inner circumferential diameter of each of the wheels and is fixed to the center of the wheels, and
      a bearing portion that has an inner circumferential surface formed with a diameter larger than an outer circumferential diameter of the axle and supports the axle via bearings made of ceramics that are inserted between the inner circumferential surface and the outer circumferential surface of the axle.

4. The electromagnetic wave measuring apparatus according to claim 3,
   wherein the base portion includes a tapered portion having a predetermined angle with respect to the bottom surface of the base portion, the tapered portion being formed at an end of the base portion and subjected to rounding processing.

5. The electromagnetic wave measuring apparatus according to claim 4,
   wherein the base portion is formed so that each thickness of the respective portions in the vertical direction with respect to the floor is set to 10 mm or less.

6. The electromagnetic wave measuring apparatus according to claim 5,
   wherein the antenna mast and the mast-fixing portion are formed of a material having conductivity lower than conductivity of metal.

7. The electromagnetic wave measuring apparatus according to claim 3,
   wherein the base portion is stopped with the wheels being fit in dents formed on the floor.

8. The electromagnetic wave measuring apparatus according to claim 3,
   wherein the base portion includes a frame that prevents distortion deformation of the base portion.

* * * * *